US011960853B2

United States Patent
Langhammer et al.

(10) Patent No.: US 11,960,853 B2
(45) Date of Patent: Apr. 16, 2024

(54) FOLDED INTEGER MULTIPLICATION FOR FIELD-PROGRAMMABLE GATE ARRAYS

(71) Applicant: Intel Corporation, Santa Clara, CA (US)

(72) Inventors: Martin Langhammer, Alderbury (GB); Bogdan Mihai Pasca, Toulouse (FR)

(73) Assignee: Intel Corporation, Santa Clara, CA (US)

( * ) Notice: Subject to any disclaimer, the term of this patent is extended or adjusted under 35 U.S.C. 154(b) by 167 days.

(21) Appl. No.: 17/214,673

(22) Filed: Mar. 26, 2021

(65) Prior Publication Data

US 2021/0216281 A1 Jul. 15, 2021

Related U.S. Application Data

(60) Provisional application No. 63/004,469, filed on Apr. 2, 2020.

(51) Int. Cl.
  *G06F 7/52* (2006.01)
  *G06F 7/523* (2006.01)
  *H03K 19/177* (2020.01)

(52) U.S. Cl.
  CPC ............... *G06F 7/52* (2013.01); *G06F 7/523* (2013.01); *H03K 19/177* (2013.01)

(58) Field of Classification Search
  CPC .......... G06F 7/52–5375; G06F 7/5443; G06F 7/523; H03K 19/177
  See application file for complete search history.

(56) References Cited

U.S. PATENT DOCUMENTS

| | | | | |
|---|---|---|---|---|
| 5,974,435 | A * | 10/1999 | Abbott | G06F 7/544 |
| | | | | 708/523 |
| 6,538,470 | B1 * | 3/2003 | Langhammer | G06F 7/5095 |
| | | | | 326/38 |
| 2011/0106872 | A1 * | 5/2011 | Hasenplaugh | G06F 7/5324 |
| | | | | 708/631 |

FOREIGN PATENT DOCUMENTS

KR  100434957 B1 *  6/2004 ............. G06F 7/722

OTHER PUBLICATIONS

S. 'Ismail, Efficient hardware architectures for cryptographic algorithms used in computer and communication systems, PhD Diss., Anadolu University (Turkey), 2015. (Year: 2015).*

(Continued)

*Primary Examiner* — Jyoti Mehta
*Assistant Examiner* — Vivian Diem Ha Ledynh
(74) *Attorney, Agent, or Firm* — Fletcher Yoder, P.C.

(57) ABSTRACT

Folded integer multiplier (FIM) circuitry includes a multiplier configurable to perform multiplication and a first addition/subtraction unit and a second addition/subtraction unit both configurable to perform addition and subtraction. The FIM circuitry is configurable to determine each product of a plurality of products for a plurality of pairs of input values having a first number of bits by performing, using the first and second addition/subtraction units, a plurality of operations involving addition or subtraction, and performing, using the multiplier, a plurality of multiplication operations involving values having fewer bits than the first number of bits. The plurality of multiplication operations includes a first number of multiplication operations, and the multiplier is configurable to begin performing all multiplication operations of the plurality of multiplication operations within a first number of clock cycles equal to the first number of multiplication operations.

20 Claims, 15 Drawing Sheets
(7 of 15 Drawing Sheet(s) Filed in Color)

(56) References Cited

OTHER PUBLICATIONS

D. Ryu, Machine Translation of Ryu (KR 100434957 B1), 2004. (Year: 2004).*
F. de Dinechin and B. Pasca, "Large multipliers with fewer DSP blocks," 2009 International Conference on Field Programmable Logic and Applications, Prague, Czech Republic, 2009, pp. 250-255, doi: 10.1109/FPL.2009.5272296 (Year: 2009).*
J. L. Hennessy and D. A. Patterson, Computer Architecture, Fifth Edition: A Quantitative Approach, 5th ed. San Francisco, CA, USA : Morgan Kaufmann Publishers Inc., 2011. (Year: 2011).*
Laurent Imbert, et al., "A Full RNS Implementation of RSA", IEEE Transactions on Computers, vol. 53, No. 5, May 2004, 6 pgs.
Ciara Rafferty, et al., "Evaluation of Large Integer Multiplication Methods on Hardware", IEEE Transactions on Computers vol. 66, No. 8, Aug. 2017, https://doi.org/10.1109/TC.2017.2677426, 14 pgs.
Intel, Intel Stratix 10 Embedded Memory Guide, Aug. 8, 2020, 125 pgs.
A. Karatsuba, et al., "Multiplication of Multidigit Numbers on Automata", Cybernetics and Control Theory, Soviet Physics—Doklady, vol. 7, No. 7, Jan. 1963, 2 pgs.
Martin Kumm, et al., "Karatsuba with Rectangular Multipliers for FPGAs", Conference Paper—Jun. 2018, 8 pgs.
Sebastian Banescu et al., "Multipliers for Floating-Point Double Precision and Beyond on FPGAs", LIP Research Report RR2010-15, HAL archives-ouvertes, Highly Efficient Accelerators and Reconfigurable Technologies, Jun. 2010, Tsukuba, Japan, https://hal-ens-lyon.archives-ouvertes.fr/ensl-00475781v2, 6 pgs.
Bogdan Mihai Pasca, "High-performnce floating-point computing on reconfigurable circuits", HAL archives-ouvertes, ENS LYON, 2011, https://tel.archives-ouvertes.fr/tel-00654121v2, 198 pgs.
Gregory J. Chaitin, et al., "Register Allocation Via Coloring", Computer Languages, vol. 6, pp. 47 to 57, 1981, 11 pgs.
Hong Diep Nguyen, et al., "FPGA-Specific Arithmetic Optimizations of Short-Latency Adders" LIP Research Report RR2010-35, 2011 International Conference on Field Programmable Logic and Applications (FPL), Sep. 2011, Chania, Greece. pp. 232-237, https://hal-ens-lyon.archives-ouvertes.fr/ensl-00542389, 8 pgs.

* cited by examiner

FOLDED INTEGER MULTIPLICATION FOR FIELD-PROGRAMMABLE GATE ARRAYS

CROSS-REFERENCE TO RELATED APPLICATIONS

This application claims the benefit of U.S. Provisional Application Ser. No. 63/004,469, entitled "Folded Integer Multiplication for Field-Programmable Gate Arrays," filed Apr. 2, 2020, which is hereby incorporated by reference in its entirety and for all purposes.

BACKGROUND

The present disclosure relates generally to integrated circuit (IC) devices such as programmable logic devices (PLDs). More particularly, the present disclosure relates to techniques for designing and implementing multiplier circuitry on integrated circuit devices, as well as performing multiplication operations on integrated circuit devices, including programmable logic devices such as field-programmable gate arrays (FPGAs).

This section is intended to introduce the reader to various aspects of art that may be related to various aspects of the present disclosure, which are described and/or claimed below. This discussion is believed to be helpful in providing the reader with background information to facilitate a better understanding of the various aspects of the present disclosure. Accordingly, it may be understood that these statements are to be read in this light, and not as admissions of prior art.

Integrated circuit devices may be utilized for a variety of purposes or applications, such as digital signal processing, machine learning, and cryptocurrency or other blockchain-related applications. Programmable logic devices may be utilized to perform these functions, for example, using particular circuitry (e.g., processing blocks). However, in some cases in which relatively large numbers of computations are performed, the particular circuitry may operate with an undesirably high latency, occupy an undesirable amount of area on an integrated circuit device, have an undesirably low processing throughput, or a combination thereof.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

Various aspects of this disclosure may be better understood upon reading the following detailed description and upon reference to the drawings in which.

DETAILED DESCRIPTION OF SPECIFIC EMBODIMENTS

Figure 1:
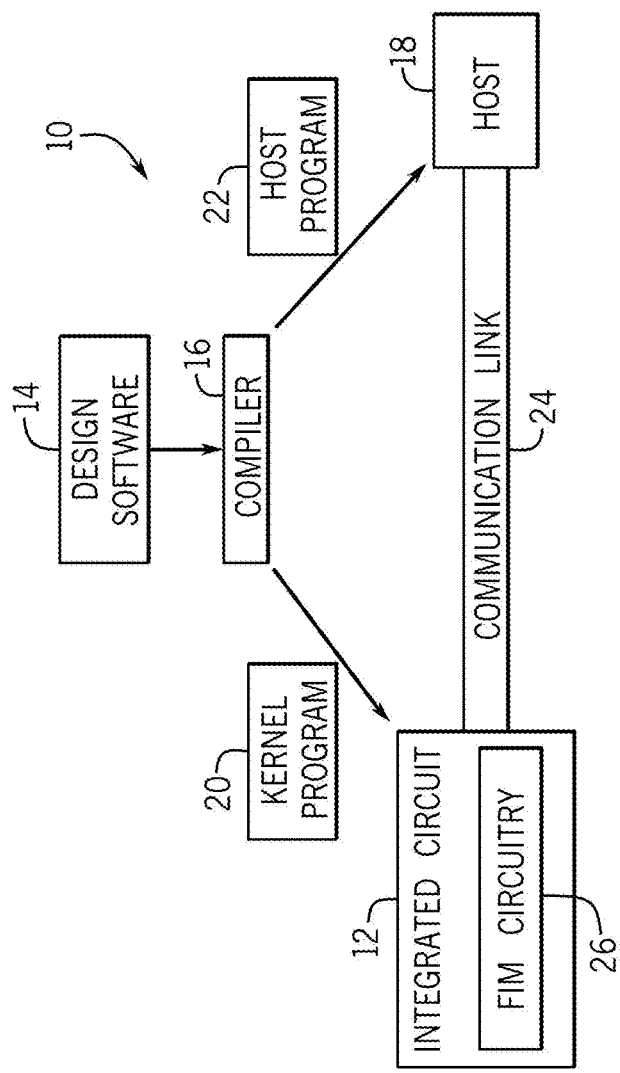
FIG. 1 is a block diagram of a system that may implement arithmetic operations using folded integer multiplier circuitry, in accordance with an embodiment of the present disclosure.

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

When introducing elements of various embodiments of the present disclosure, the articles "a," "an," and "the" are intended to mean that there are one or more of the elements. The terms "including" and "having" are intended to be inclusive and mean that there may be additional elements other than the listed elements. Additionally, it should be understood that references to "some embodiments," "embodiments," "one embodiment," or "an embodiment" of the present disclosure are not intended to be interpreted as excluding the existence of additional embodiments that also incorporate the recited features. Furthermore, the phrase A "based on" B is intended to mean that A is at least partially based on B. Moreover, the term "or" is intended to be inclusive (e.g., logical OR) and not exclusive (e.g., logical XOR). In other words, the phrase A "or" B is intended to mean A, B, or both A and B.

As various applications such as machine leaning, artificial intelligence applications, cryptocurrency-related applications, and digital signal processing (DSP) applications have become ever more prevalent, there is an increasing desire to perform various operations associated with these applications in more efficient manners. For example, there may be a desire to alter (e.g., reduce) the amount of circuitry utilized to perform one or more these operations in order to provide space for circuitry to perform one or more other operations. Similarly, there may be a desire to decrease the amount of time used to perform the operations associated with these applications. In other words, performing these operations in a lower latency manner may be desirable, for example, to enable the operations to be performed more quickly. Keeping this in mind, the presently described techniques relate to multiplier circuitry (e.g., a folded integer multiplier) with a reduced latency that may be utilized for several applications. For example, relatively large multiplication operations may be performed by an integrated circuit device, including programmable logic devices such as FPGAs, application-specific standard products (ASSPs), and application-specific integrated circuits (ASICs) when utilized for machine leaning, artificial intelligence applications, and cryptocurrency-related applications. As discussed below, circuitry included on an integrated circuit device (e.g., DSP circuitry, multiplier circuitry, adder circuitry) may be utilized to implement a large multiplier (e.g., a folded integer multiplier) that performs multiplication with low latency.

As a more specific example, integrated circuit devices may perform mathematical operations associated with certain algorithms such as the Rivest-Shamir-Adleman (RSA) utilized for encrypting and decrypting data (e.g., in cryptocurrency or blockchain applications). Generally speaking, a large multiplier (e.g., a multiplier that processes words having hundreds or thousands of bits of data) may be used to perform such operations. Such a multiplier may aggregate DSP blocks included on an integrated circuit device, such as a programmable logic device. However, aggregating the DSP blocks in a manner that provides desirable processing power and latency can be challenging because of the large amount of programmable logic that may be used to route data, perform arithmetic operations (e.g., addition), or both. As time progresses, the sizes of words utilized in encryption and decryption algorithms may also increase (e.g., from 1028 bits to 4096 bits). Accordingly, being able to perform multiplication involving large words in a high performance manner is desirable. The folded integer multiplier circuitry discussed below may process relatively large words (e.g., words with word lengths greater than 1,000 bits) with high performance and low latency.

With the foregoing in mind, FIG. 1 is a block diagram of a system 10 that may implement arithmetic operations, such as multiplication, using multiplier circuitry. A designer may desire to implement functionality, such as the large precision arithmetic operations of this disclosure, on an integrated circuit device 12 (such as a field-programmable gate array (FPGA) or an application-specific integrated circuit (ASIC)). In some cases, the designer may specify a high-level program to be implemented, such as an OpenCL program, which may enable the designer to more efficiently and easily provide programming instructions to configure a set of programmable logic cells for the integrated circuit device 12 without specific knowledge of low-level hardware description languages (e.g., Verilog or VHDL). For example, because OpenCL is quite similar to other high-level programming languages, such as C++, designers of programmable logic familiar with such programming languages may have a reduced learning curve than designers that are required to learn unfamiliar low-level hardware description languages to implement new functionalities in the integrated circuit device 12.

Designers may implement their high-level designs using design software 14, such as a version of Intel® Quartus® by INTEL CORPORATION. The design software 14 may use a compiler 16 to convert the high-level program into a lower-level description. The compiler 16 may provide machine-readable instructions representative of the high-level program to a host 18 and the integrated circuit device 12. The host 18 may receive a host program 22 which may be implemented by the kernel programs 20. To implement the host program 22, the host 18 may communicate instructions from the host program 22 to the integrated circuit device 12 via a communications link 24, which may be, for example, direct memory access (DMA) communications or peripheral component interconnect express (PCIe) communications. In some embodiments, the kernel programs 20 and the host 18 may enable configuration of folded integer multiplier (FIM) circuitry 26 on the integrated circuit device 12. The folded integer multiplier circuitry 26 may include circuitry that is utilized to perform several different operations. For example, as discussed below, the folded integer multiplier circuitry 26 may include one or more multipliers and adders that are respectively utilized to perform multiplication and addition operations. Accordingly, the folded integer multiplier circuitry 26 may include circuitry to implement, for example, operations to perform multiplication that may be used for various applications, such as encryption, decryption, and blockchain application. As additionally, discussed below, the folded integer multiplier circuitry 26 may include DSP blocks (e.g., DSP blocks out of many (e.g., hundreds or thousands) DSP blocks included in the integrated circuit device 12). Furthermore, adder circuitry may be included in the folded integer multiplier circuitry 26, for example, to add subproducts that are determined when performing multiplication operations.

While the discussion above describes the application of a high-level program, in some embodiments, the designer may use the design software 14 to generate and/or to specify a low-level program, such as the low-level hardware description languages described above. Further, in some embodiments, the system 10 may be implemented without a separate host program 22. Furthermore, in other embodiments, the folded integer multiplier circuitry 26 may be partially implemented in portions of the integrated circuitry device 12 that are programmable by the end user (e.g., soft logic) and in parts of the integrated circuit device 12 that are not programmable by the end user (e.g., hard logic). For example, DSP blocks may be implemented in hard logic, while other circuitry included in the folded integer multiplier circuitry 26, including the circuitry utilized for routing data between portions of the multiplier circuitry, may be implemented in soft logic. Thus, embodiments described herein are intended to be illustrative and not limiting.

Figure 2:
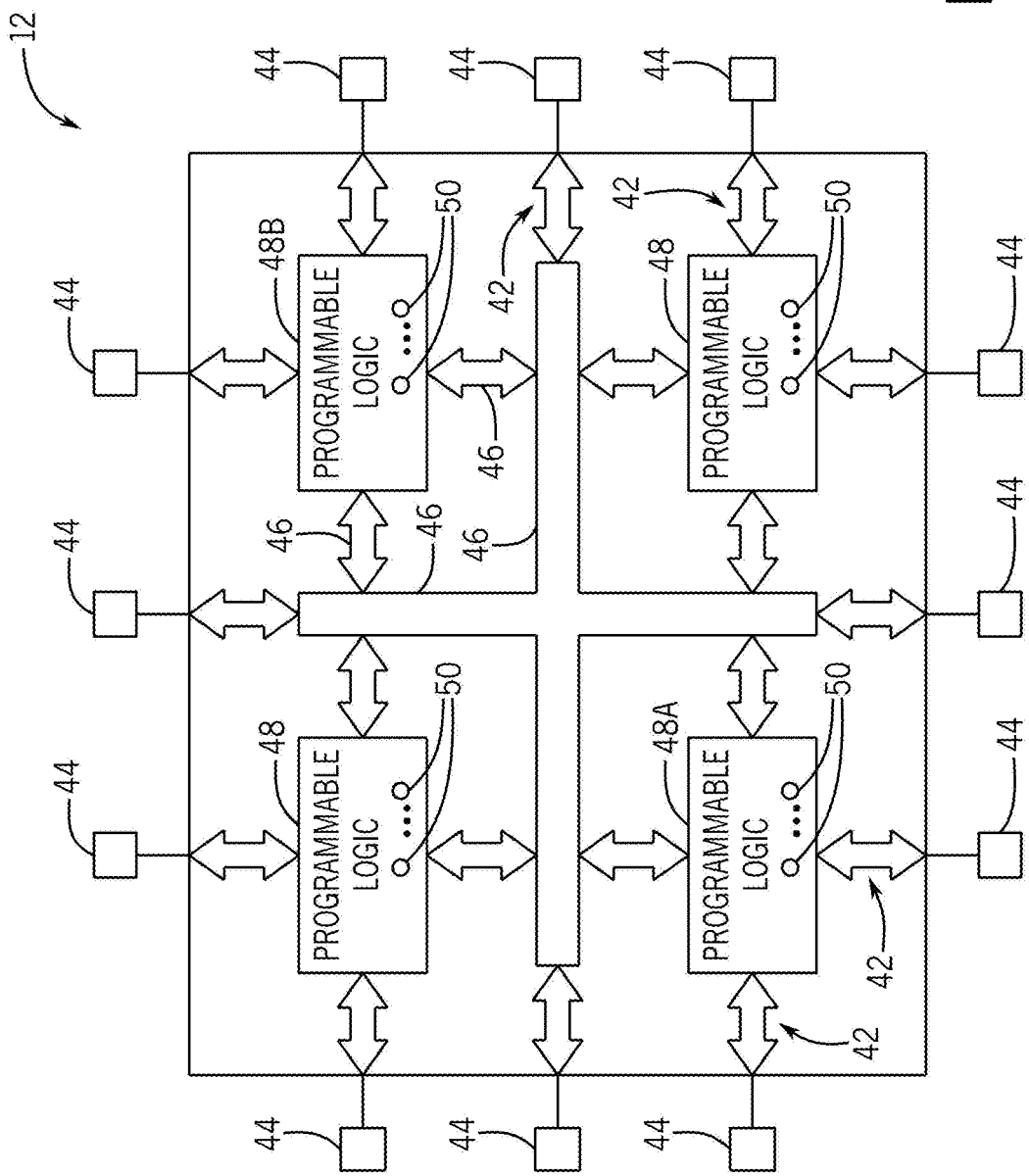
FIG. 2 is a block diagram of an example of the integrated circuit device of FIG. 1, in accordance with an embodiment of the present disclosure.

Turning now to a more detailed discussion of the integrated circuit device 12, FIG. 2 illustrates an example of the integrated circuit device 12 as a programmable logic device, such as a field-programmable gate array (FPGA). Further, it should be understood that the integrated circuit device 12 may be any other suitable type of integrated circuit device (e.g., an application-specific integrated circuit and/or application-specific standard product). As shown, the integrated circuit device 12 may have input/output circuitry 42 for driving signals off device and for receiving signals from other devices via input/output pins 44. Interconnection resources 46, such as global and local vertical and horizontal conductive lines and buses, may be used to route signals on integrated circuit device 12. Additionally, interconnection resources 46 may include fixed interconnects (conductive lines) and programmable interconnects (e.g., programmable connections between respective fixed interconnects). Programmable logic 48 may include combinational and sequential logic circuitry. For example, programmable logic 48 may include look-up tables, registers, and multiplexers. In various embodiments, the programmable logic 48 may be configured to perform a custom logic function. The programmable interconnects associated with interconnection resources may be considered to be a part of the programmable logic 48.

Programmable logic devices, which the integrated circuit device 12 may represent, may contain programmable elements 50 within the programmable logic 48. For example, as discussed above, a designer (e.g., a customer) may program (e.g., configure) the programmable logic 48 to perform one or more desired functions. By way of example, some programmable logic devices may be programmed by configuring their programmable elements 50 using mask programming arrangements, which is performed during semiconductor manufacturing. Other programmable logic devices are configured after semiconductor fabrication operations have been completed, such as by using electrical programming or laser programming to program their programmable elements 50. In general, programmable elements 50 may be based on any suitable programmable technology, such as fuses, antifuses, electrically-programmable read-only-memory technology, random-access memory cells, mask-programmed elements, and so forth.

Many programmable logic devices are electrically programmed. With electrical programming arrangements, the programmable elements 50 may be formed from one or more memory cells. For example, during programming, configuration data is loaded into the memory cells using pins 44 and input/output circuitry 42. In one embodiment, the memory cells may be implemented as random-access-memory (RAM) cells. The use of memory cells based on RAM technology is described herein is intended to be only one example. Further, because these RAM cells are loaded with configuration data during programming, they are sometimes referred to as configuration RAM cells (CRAM). These memory cells may each provide a corresponding static control output signal that controls the state of an associated logic component in programmable logic 48. For instance, in some embodiments, the output signals may be applied to the gates of metal-oxide-semiconductor (MOS) transistors within the programmable logic 48.

Keeping the foregoing in mind, the folded integer multiplier circuitry 26 discussed herein may be utilized for a variety of applications and to perform many different operations associated with the applications, such as multiplication and addition. For example, multiplication and addition operations that involve large words may be well suited for encryption, decryption, and cryptocurrency applications. As discussed below, the folded integer multiplier circuitry 26 may reduce latency associated with multiplication and addition operations. With that said, before discussing the folded integer multiplier circuitry 26 in more detail, several examples, equations, and figures will be discussed to help provide an overview for how the folded integer multiplier circuitry 26 may be designed and implemented.

Let X and Y be N-bit values having the product P=XY which is 2N bits wide. We define $k=\lfloor N/2 \rfloor$ and split X and Y into two terms according to Equation 1 and Equation 2 below:

$$X = x_h 2^k + x_l \qquad \text{Equation 1}$$

$$Y = y_h 2^k + y_l \qquad \text{Equation 2}$$

The lower terms $x_l$, $y_l$ will be k bits wide, whereas the upper terms $x_h$, $y_h$ may be one bit narrower. Using this operand decomposition, the product P can be written as provided in Equation 3 below:

$$\begin{aligned} P &= XY \qquad &\text{Equation 3}\\ &= (x_h 2^k + x_l)(y_h 2^k + y_l)\\ &= \underbrace{x_h y_h}_{m_1} 2^{2k} + (x_h y_l + x_l y_h) 2^k + \underbrace{x_l y_l}_{m_0} \end{aligned}$$

The expression in Equation 3 shows how the wider XY multiplication may be implemented using 4 k-bit multiplications: $x_h y_h$, $x_h y_l$, $x_l y_h$, and $x_l y_l$. This decomposition can be recursively applied on the k-bit multiplications so that 16 k/2-bit multiplications can be used for implementing the same product XY.

The number of multiplication operations in Equation 3 can be reduced at the cost of performing additional addition operations (which can typically be performed more quickly than multiplication operations by integrated circuit devices). Indeed, for the same operand splitting, an additional term, $m_2$ is computed according to Equation 4:

$$\begin{aligned} m_2 &= \underbrace{(x_h + x_l)}_{a_0}\underbrace{(y_h + y_l)}_{a_1} \qquad &\text{Equation 4}\\ &= \underbrace{x_h y_h}_{m_1} + \underbrace{x_l y_l}_{m_0} + (x_h y_l + x_l y_h) \end{aligned}$$

The $(x_h y_l + x_l y_h)$ term in Equation 3 can be rewritten as expressed below in Equation 5.

$$x_h y_l + x_l y_h = m_2 - (m_1 + m_0) \qquad \text{Equation 5}$$

Equation 5 may be placed into Equation 3, thereby allowing the product P to be rewritten according to Equation 6:

$$P = m_1 2^{2k} + (m_2 - (m_0 + m_1)) 2^k + m_0 \qquad \text{Equation 6}$$

Consequently, for even values of N, P may be computed by determining three products: $m_0$, $m_1$ (which are k-bits wide), and m2 (which is k+1-bits wide).

Figure 3:
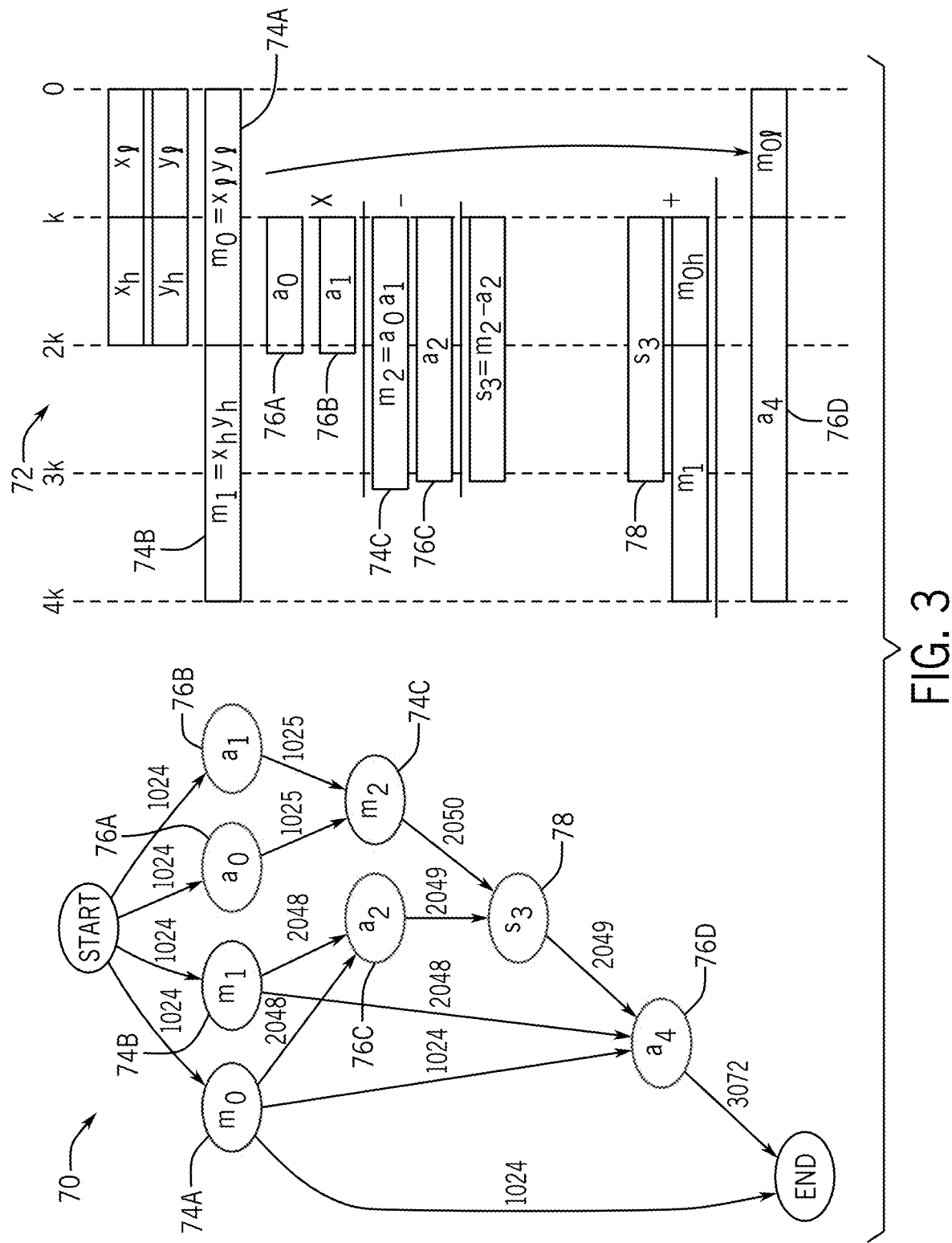
FIG. 3 illustrates a first graph showing dependencies between operations in a single-level Karatsuba decomposition and a second graph showing fixed-point operand alignments for the arithmetic operations, in accordance with an embodiment of the present disclosure.

Keeping the discussion of Equations 1-6 in mind, FIG. 3 illustrates the dependencies between the arithmetic operations in a single-level Karatsuba decomposition as expressed in Equation 6. In particular, FIG. 3 includes a graph 70 showing such dependencies and a graph 72 showing fixed-point operand alignments for the different operations. As indicated in the graph 70 and graph 72, three multiplication operations 74 (e.g., multiplication operations 74A-74C) and five operations involving addition or subtraction (e.g., addition operations 76A-76D and subtraction operations 78) are performed. As illustrated, addition operation 76C depends on multiplication operations 74A, 74B, multiplication operation 74C depends on addition operations 76A, 76B, subtraction operation 78 depends on addition operation 76C and multiplication operation 74C, and addition operation 76D depends on multiplication operations 74A, 74B and subtraction operation 78.

The graph 72 may also be expressed as an expression, such as provided below in Equation 7:

$$P = m_1 2^{2k} + \underbrace{\underbrace{(m_2)}_{a_0 a_1} - \underbrace{(m_0 + m_1)}_{a_2})2^k}_{s_3} + m_0 \qquad \text{Equation 7}$$

$$= m_1 2^{2k} + (m_2 - (m_0 + m_1))2^k + (m_{0h} 2^k + m_{0l})$$

$$= \underbrace{\underbrace{(m_1 \& m_{0h} + s_3)}_{a_1} \& m_{0l}}_{end}$$

where the "&" is used to indicate the concatenation of signals. This operation is essentially free when implemented on hardware as it merely involves rewiring.

Before proceeding to discuss how this technique may be applied for higher level decompositions, it should be noted that nodes (e.g., ovals) included in FIGS. 3, 4, and 6-8 corresponding to multiplication operations have blue borders, while addition and subtraction operations are shown with red borders.

Figure 4:
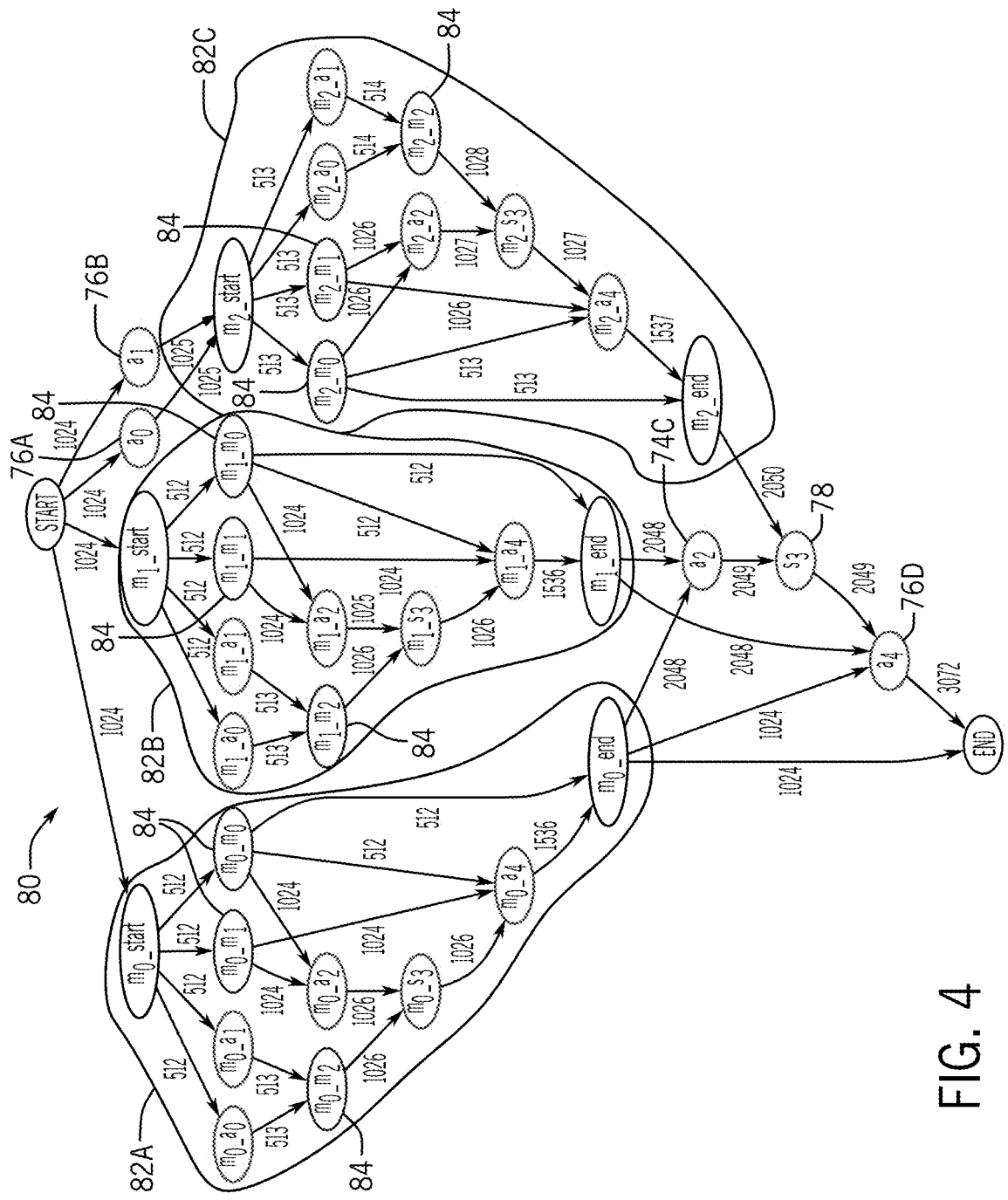
FIG. 4 is a graph showing arithmetic operations in a two-level Karatsuba decomposition, in accordance with an embodiment of the present disclosure.

The technique described above may be recursively applied to on the multiplication operations 74 to give a total of nine multiplication operations when another level of decomposition is performed. FIG. 4 illustrates a graph 80 showing arithmetic operations performed in such a two-level decomposition. In particular, operations associated with multiplication operations 74A, 74B, 74C of FIG. 4 respectively correspond to multiplication operations 82A, 82B, 82C of the graph 80. Each of the multiplication operations 82A-82C includes several multiplication operations (generally indicated as multiplication operations 84), while the operations included in the multiplication operations 82A-82C are addition operations. In FIG. 4, it should be noted that graph items including the word "start" or "end" are not operations, but rather respectively indicate the beginning or end of one of the multiplication operations 82A-82C.

Keeping the foregoing in mind, the folded integer multiplier 26 is a multi-cycle (folded) multiplier implementation based on the two-level decomposition illustrated in the graph 80. As such, the folded integer multiplier 26 may trade-off resource utilization for throughput. As will be discussed below, on the resource utilization side—more particularly on the embedded multiplier count—the DSP budget is one-ninth the resources of implementing the structure shown in the graph 80 in a "flat" implementation (i.e., when there is one functional unit in a hardware implementation for each operation included in the graph 80). Stated differently, the folded integer multiplier circuitry 26 only includes one multiplier (e.g., multiplier circuitry) while the graph 80 includes nine multiplication operations 84. Accordingly, the folded integer multiplier circuitry 26 may operate best at one-ninth of the throughput of an equivalent "flat" multiplier implementation.

Figure 5:
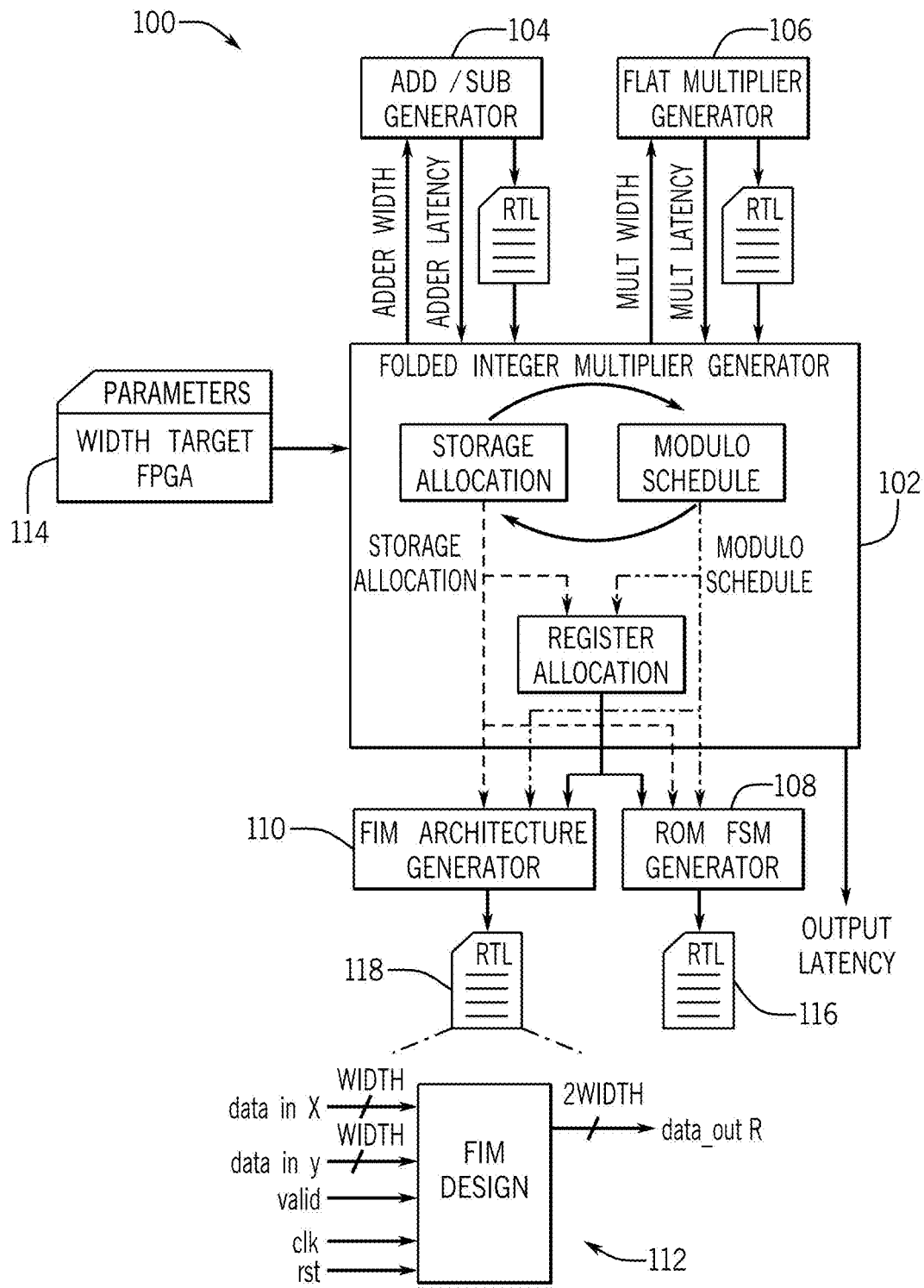
FIG. 5 is a block diagram of a design generator that may generate designs of folded integer multiplier circuitry, in accordance with an embodiment of the present disclosure.

To this end, FIG. 5 illustrates a design generator 100 that may be implemented via the design software 14 and compiler 16 to generate a design of a hardware implementation for the folded integer multiplier circuitry 26 as described in the preceding paragraph. The design generator 100, as illustrated, includes a FIM generator 102 as well as a add/sub generator 104, flat multiplier generator 106, control circuitry generator 108, and FIM architecture generator 110 that may operate with the FIM generator to generate a hardware implementation 112 of the FIM circuitry 26.

The FIM generator receives parameters 114 (e.g., via a user input made using the design software) indicating a particular integrated circuit device (e.g., a model of an FPGA) for which the hardware implantation 112 will be designed. The parameters 114 may also include a desired width of the desired folded integer multiplier. In other words, the parameters 114 may indicate a size (e.g., maximum number of bits) of values to be multiplied by the FIM circuitry 26. Based on the parameters 114, the design generator 100 generates the hardware implementation 112, which may be provided to the integrated circuit device 12 (e.g., via the compiler 16) as low-level hardware description (e.g., as a bitstream) to cause the hardware implementation 112 (and, thus, the FIM circuitry 26) to be physically implemented on the integrated circuit device 12.

The add/sub generator 104 may determine parameters regarding circuitry to be included in the FIM circuitry 26 that performs addition and subtraction (e.g., adder circuitry). Similarly, the flat multiplier generator 106 may determine parameters regarding multiplier circuitry to be included in the FIM circuitry 26. More specifically, the add/sub generator 104 and the flat multiplier 106 may respectively determine designs for adder circuitry and multiplier circuitry to be included in a design of the FIM circuitry (e.g., hardware implementation 114).

Based on the parameters 114 and outputs of the add/sub generator 104 and flat multiplier generator 106, the FIM generator 102 may determine storage allocation and a modulo schedule, each of which is discussed in more detail below. Furthermore, based on a determined storage allocation and modulo schedule, the FIM generator 102 may determine register allocation for an implementation of the FIM circuitry 26. Data regarding the determined storage allocation, modulo schedule, and register allocation may be provided to the control circuitry generator 108, which in turn may determine a description 116 indicating control circuitry and operations to respectively be implemented on and performed by the integrated circuit device 12 once the FIM circuitry 26 has been implemented on the integrated circuit device 12. For example, as discussed below, the FIM circuitry 26 may include a read-only memory (ROM) finite state machine (FSM).

Data regarding the determined storage allocation, modulo schedule, and register allocation may also be provided to the FIM architecture generator 110, and the FIM architecture generator 110 may determine the hardware implementation 112 based on the storage allocation, modulo schedule, and register allocation. In other words, the FIM architecture generator may determine (and generate) a description 118 of the hardware implementation 112 that will be provided to the integrated circuit device 12 to cause the FIM circuitry 26 to be implemented on the integrated circuit device 12. For example, the compiler 16 may generate a bitstream that includes a hardware description (e.g., Verilog code) of the hardware implementation 112 and indicates how the FIM circuitry 26 is to operate (e.g., be controlled) to execute a program or instruction that may be provided by a design (e.g., source code of a high-level program).

Keeping the foregoing discussion in mind, functional units (e.g., multiplier circuitry, adder circuitry) that may be utilized to perform multiplication operations, addition operations, and subtractions will now be discussed. Returning briefly to FIG. 4, which shows multiplication of values that are 2048 bits, the largest multiplication operation 84 (which is part of multiplication operation 82C) is 514 bits wide. Because of this, a 514-bit multiplier (e.g., a 514-bit square unsigned multiplier) may be utilized as the multiplier circuitry to be included in the FIM circuitry 26. Each of the multiplication operations 84 may be mapped on the 514-bit multiplier and can be executed at a different scheduled time. For multiplication operations 84 that involve smaller values (e.g., 512-bit and 513-bit multiplication operations), the inputs may be zero-extended to 514 bits.

Determining functional units to perform addition and subtraction operations will now be discussed. As listed in Table 1 below, which indicates the widths (e.g., number of bits) and type of operations associated with the addition and subtraction operations indicated by the graph 80 of FIG. 4, there are twenty addition and subtraction operations to be performed:

TABLE 1

| Operation | Width | Name |
|---|---|---|
| add | 513 | $m_0\_a_0, m_0\_a_1, m_1\_a_0, m_1\_a_0$ |
| add | 514 | $m_2\_a_0, m_2\_a_1$ |
| add | 1025 | $a_0, a_1, m_0\_a_2, m_1\_a_2$ |
| add | 1027 | $m_2\_a_2$ |
| sub | 1026 | $m_0\_s_3, m_1\_s_3$ |
| sub | 1027 | $m_2\_s_3$ |
| add | 1536 | $m_0\_a_4, m_1\_a_4$ |
| add | 1537 | $m_2\_a_4, m_1\_a_4$ |
| add | 2049 | $a_2$ |
| sub | 2049 | $s_3$ |
| add | 3072 | $a_4$ |

As indicated by Table 1, the widths range in size from 513 to 3072 bits. To determine the width of addition and subtraction units (which may be referred to as "add/sub circuitry") various considerations may be considered (e.g., by a designer or by the design generator 100). For example, the number and size of add/sub units will also weigh-in to the final resource utilization of the FIM. Additionally, the add/sub units used will write the operation results into storage elements. In one embodiment, the registers may store thirty-two elements (e.g., values), and using fewer than thirty-two register files entries may result in an under-utilization of the registers. Therefore, the more add/sub units included in the FIM circuitry 26, the fewer the number of operations that can be mapped to registers, which in turn leads to an increased number of under-utilized storage (e.g., registers). Keeping these factors in mind, add/sub units that support widths of up to 2052 bits may be used.

Given the widths of the multiplier (e.g., a 514-bit wide multiplier) and add/sub units (e.g., a 2052-bit wide add/sub unit), there are several transformations that may be made to the graph 80, for instance, to reduce the number of add/sub units to include in the FIM circuitry 26. As discussed below, multiple addition operations may be mapped onto the same add/sub unit. Furthermore, addition and subtraction operations involving more than 2052 bits may be split into several operations.

Figure 6:
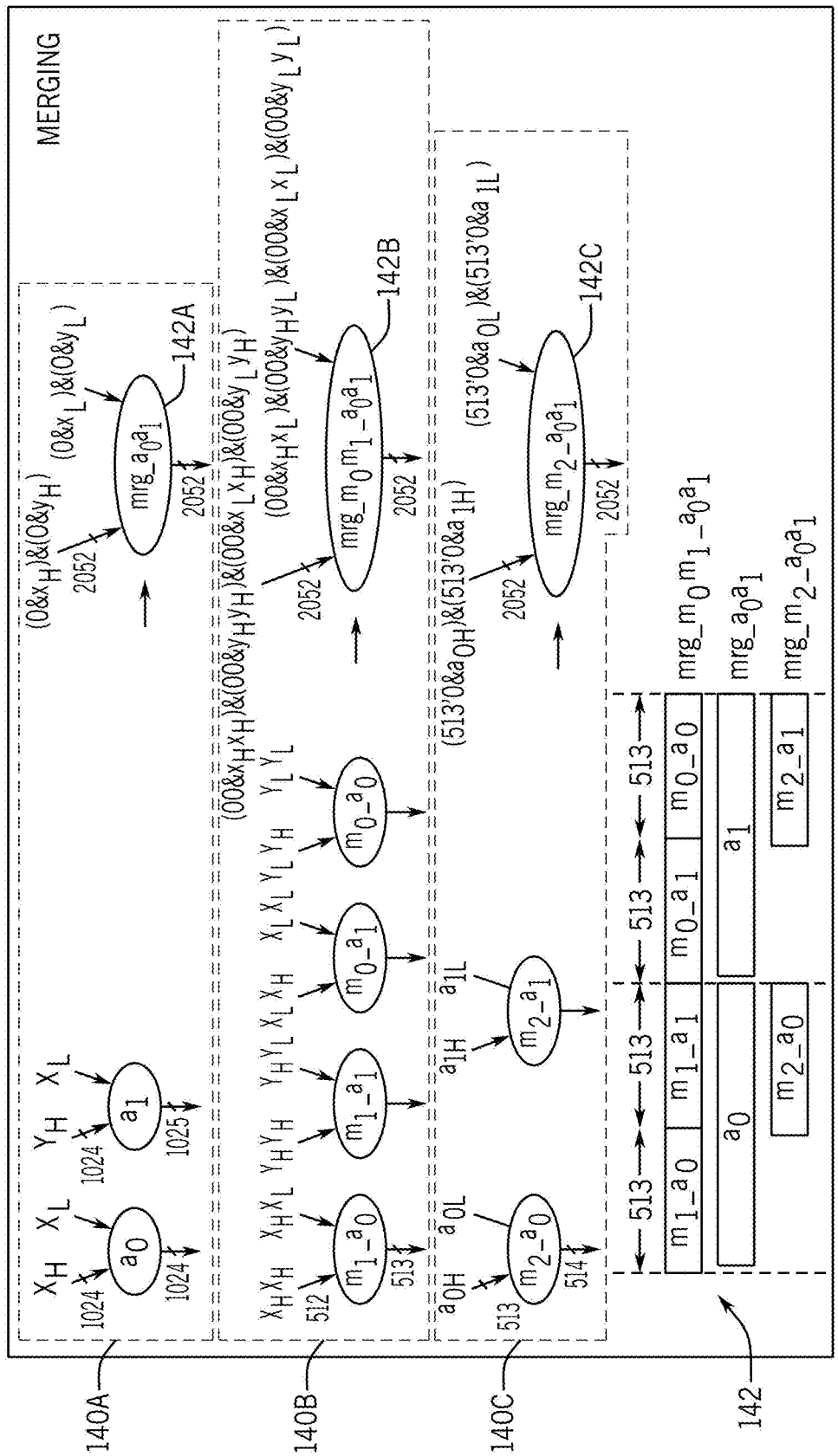
FIG. 6 illustrates operations of the graph of FIG. 4 that may be merged into fewer operations, in accordance with another embodiment of the present disclosure.

First, the merging of addition operations of the graph 80 will be discussed. As noted above, there are nine multiplication operations and twenty operations involving addition or subtraction in the graph 80. Thus, there are 2.22 addition/subtraction operations per multiplication operation. If addition operations are merged to decrease this ratio below 2:1, two add/sub units may be used to fully support the 514-bit multiplier. To reduce the number of addition operations, addition operations may be merged. FIG. 6 illustrates three mergers 140 (e.g., mergers 140A, 140B, 140C) that may be made and a graph 142 showing widths associated with the mergers 140. In other words, FIG. 6 illustrates how addition operations may be merged to create merged nodes 142A, 142B, 142C. In each of mergers 140A, 140C, two addition operations are merged into one operation, as also shown in the graph 142. In merger 140B, four addition operations are merged into a single addition operation. Furthermore, as shown in the graph 142, the addition operation associated with the merger 140B involves a 2052-bit addition. Thus, by using a 2052-bit wide add/sub unit, the merger 140B may be performed. Moreover, by performing the mergers 140A, 140B, 140C, the number of addition/subtraction operations that will be included in the graph 80 is reduced by five.

Figure 7:
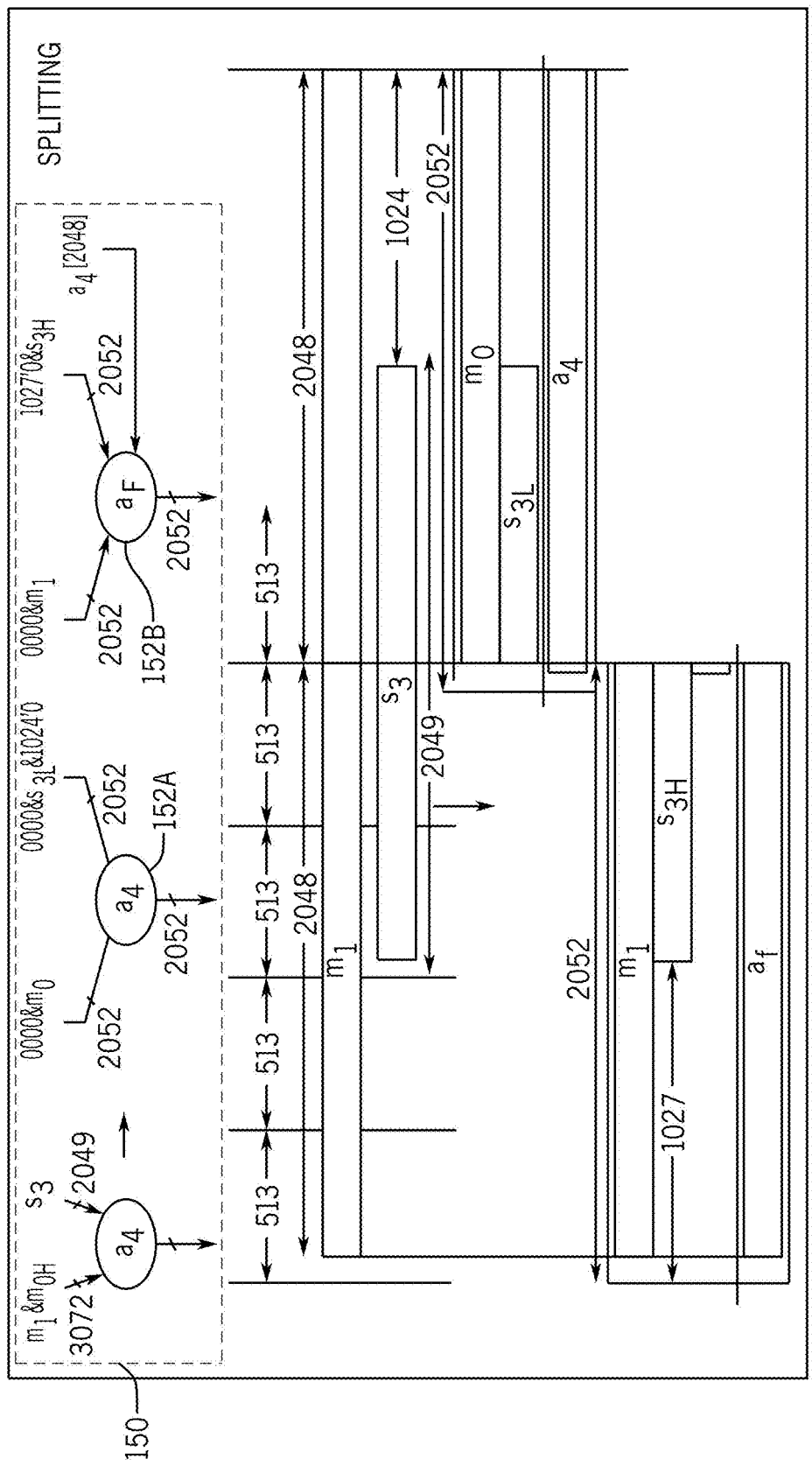
FIG. 7 illustrates an operation of the graph of FIG. 4 that may be split into two operations, in accordance with an embodiment of the present disclosure.

With that said, because there is an addition operation involving an input that has more bits than the add/sub unit is wide (e.g., 3072 bits of data versus a 2052-bit add/sub unit), node $a_4$ may be split into two nodes. For example, as shown in FIG. 7, a split 150 may be performed so that the addition operation involving 3072 bits is split into two addition operations (represented by nodes 152A, 152B). Accordingly, by performing the split 150, two addition operations involving values having widths that are not wider than the add/sub unit.

Figure 8:
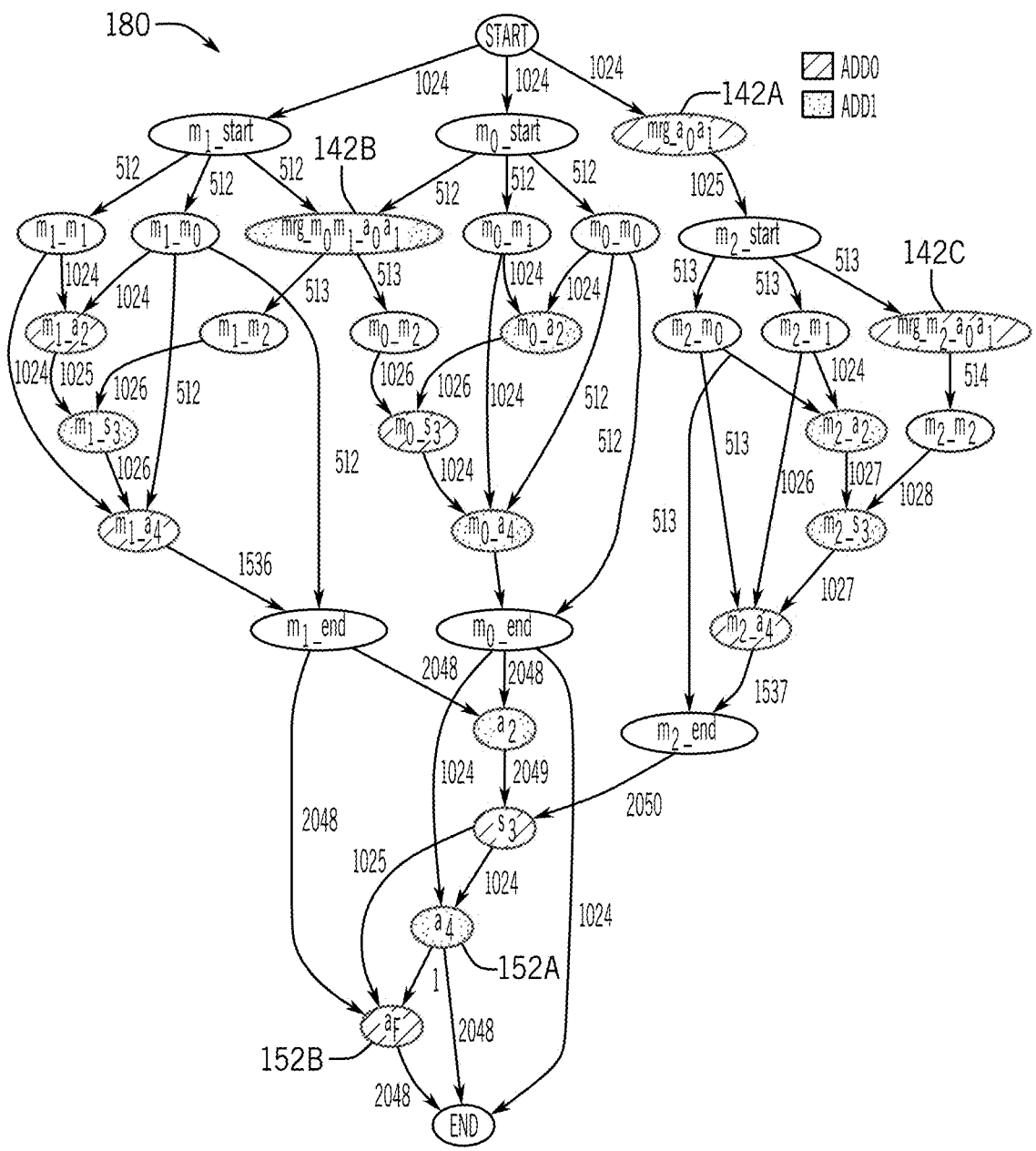
FIG. 8 is a graph showing the graph of FIG. 4 modified to implement the merged operations of FIG. 6 and the split operation of FIG. 7, in accordance with an embodiment of the present disclosure.

Considering both the mergers 140A, 140B, 140C and split 150, the twenty operations involving addition or subtraction of graph 80 are reduced to sixteen. Indeed, FIG. 8 illustrates a graph 180, which is a modified version of the graph in which nodes 142A, 142B, 142C, 152A, 152B replace nodes (e.g., as indicated in FIG. 6 and FIG. 7). In the graph 180, there are 16 operations involving addition or subtraction (as indicated by nodes that are shaded) and nine multiplication operations (corresponding to unshaded nodes). Accordingly, the ratio of the operations involving addition or subtraction to multiplication operations is 16:9, or 1.78, which is less than two. Accordingly, a hardware implementation for the FIM circuitry 26 may include two add/sub units that can perform the addition and subtraction operations to support the multiplier (e.g., a 514-bit multiplier).

Keeping the foregoing in mind, creation of a design for the FIM circuitry 26 as well as determining how the FIM circuitry 26 will operate (e.g., timing of operations performed by the FIM circuitry 26) will now be discussed. In other words, the discussion will now turn to implementations of the FIM circuitry 26, how the operations of the graph 180 may be mapped to the FIM circuitry 26, and how such operations may be scheduled to be performed by the FIM circuitry 26 (e.g., as performed by the design generator 100). While discussed below in more detail, the FIM circuitry 26 includes one multiplier (e.g., a 514-bit multiplier) and two add/sub units (e.g., 2052-bit add/sub units).

First, each operation (e.g., the sixteen operations involving addition or subtraction and the nine multiplication operations) may be allocated to a physical component included in the FIM circuitry 26. For example, because there is one multiplier, the multiplier will perform each of the nine multiplication operations. However, because there are two add/sub units, the sixteen operations involving addition or subtraction are allocated among the two add/sub units. One such allocation is shown in the graph 180 of FIG. 8. In particular, eight addition/subtraction operations (e.g., corresponding to striped nodes) are allocated to a first add/sub unit, while eight addition/subtraction operations (e.g., corresponding to dotted nodes) are allocated to a second add/sub unit. In particular, the merged nodes 142A, 142B are allocated to different add/sub units to enable addition for the merged nodes 142A, 142B to be performed so that the results of the addition operations are available to be used to perform multiplication.

Second, storage allocation may be considered. For example, results of the various operations in the graph 180 are written and kept in storage locations while other operations read necessary data from these storage locations. A valid storage allocation ensures that data required for executing an operation (e.g., two operands) is available for reading from the storage locations.

The results of operations will be stored in memory blocks that may have one port for writing data (d—the input data, aw—the write address, and w—write), and one port for reading data (ar—the read address, and q—the output data). As long as the storage depth does not exceed thirty-two elements, a single MLAB-based memory can be used for storage implementation.

Bearing this in mind, each of the compute units (e.g., the multiplier and the two/add sub units) may have two full-width storage elements assigned. For example, the nine 1028-bit products determined by the multiplier may be stored in two different registers. There may also be two registers (e.g., 2052-bit wide registers) utilized to store values generated by one add/sub unit. Thus, there may be four registers used to store sums or differences determined by the add/sub units. Furthermore, there may also be a one-bit wide register for one of the add/sub units that is used to store a carry-out value generated from performing the addition operation associated with node 152A.

Storage allocation may be performed in two parts. First, bootstrapping (pre-allocation) may be performed to constrain which register certain products will be stored on, for example, to ensure that addition operations that are dependent on the products can be issued with both operands (e.g., determined products) available for reading from different storage locations. In one embodiments, the products of the $m_1\_m_1$, $m_0\_m_1$, and $m_2\_m_1$ multiplication operations are stored on one register, while products of the $m_1\_m_0$, $m_0\_m_0$, and $m_2\_m_0$ multiplication operations are stored on another register.

Second, storage allocation may be completed. In particular, each remaining valid storage combination may be evaluated for finding a valid schedule. For example, the remaining nineteen nodes (corresponding to the three remaining multiplication operations and each of the sixteen operations involving addition or subtraction) each have two possible storage locations, meaning there are $2^{19}$ candidates (e.g., architectural possibilities) to consider. Constraints may be imposed to remove from further scheduling evaluation storage allocations that are unlikely to lead to a valid solution. For example, in one embodiment, three constraints may be imposed. First, each candidates that writes more than six times in any adder output register is dismissed to ensure load balancing over the outputs. Second, products generated from performing $mrg\_m_2\_a_0a_1$ and $m_1\_a_2$ multiplication operations are to be assigned to different storage for load balancing purposes. Third, the difference generated from performing the $s_3$ subtraction operation and the sum generated from performing the $m_0\_a_4$ addition operation may be constrained to be written to different storage so that both of these values can be read in a single clock cycle when performing the $a_4$ addition operation. In other words, if the sum and difference were stored in the same register (which may only have a single read port), it would take two clock cycles to read both of these values.

Figure 9:
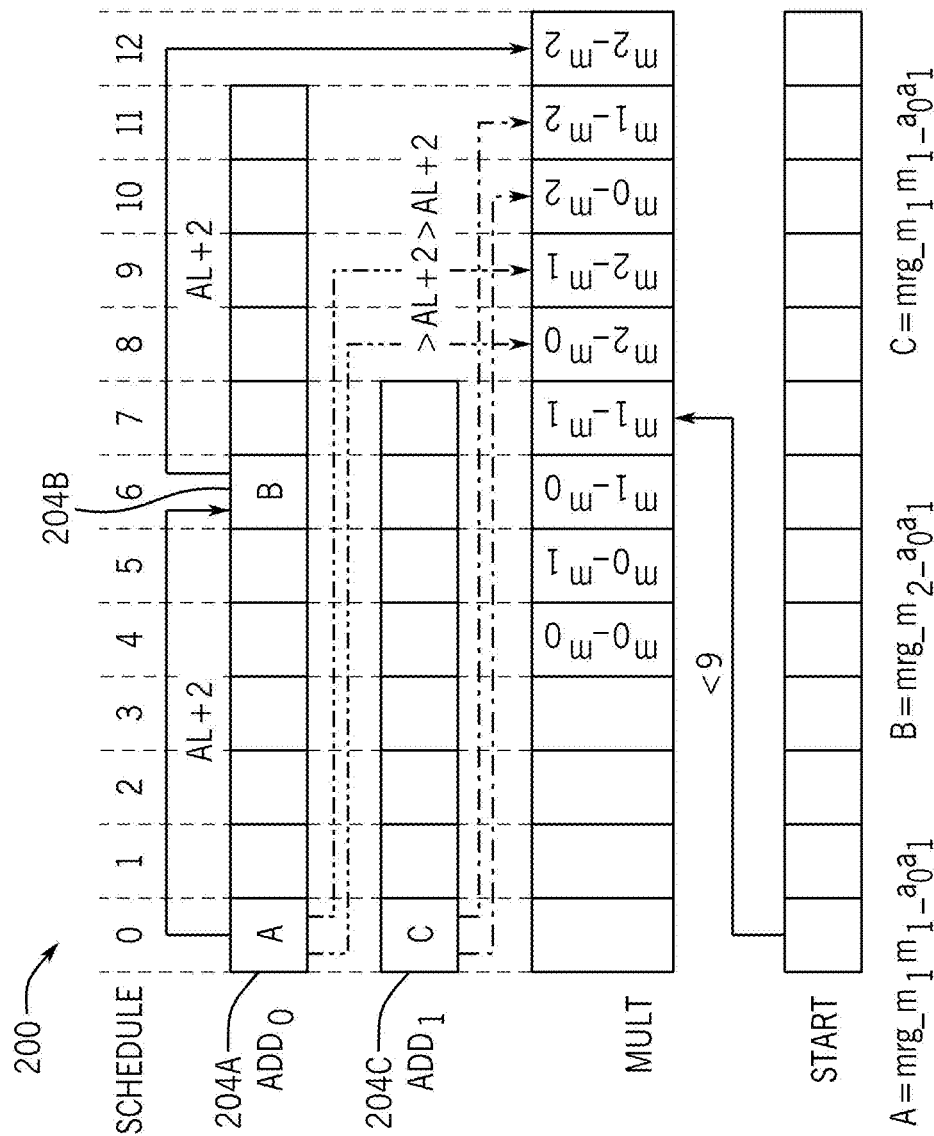
FIG. 9 illustrates a bootstrapping schedule, in accordance with an embodiment of the present disclosure.

For each valid storage allocation, the design generator 100 may determine whether a valid modulo schedule exists. In one embodiment, each valid schedule includes the multiplication operations (e.g., the nine multiplications of the graph 180) being scheduled in consecutive time steps (e.g., to enable the multiplier to operation more efficiently). Bootstrapping may be utilized to ensure that the multiplication operations are performed in such a manner. FIG. 9 illustrates a bootstrapping schedule 200 that indicates the timing of certain operations associated with two the add/sub units (as indicated by "Add$_0$" and "Add$_1$") and the multiplier (as indicated by "Mult") of the FIM circuitry 26. More specifically, the bootstrapping schedule 200 fixes the schedule of the first twelve clock cycles in such a way that the nine multiplication operations are scheduled in consecutive time-steps (e.g., with a first multiplication operation 202 being performed at time four). Additionally, addition operations 204A, 204B, 204C may be fixed as shown in FIG. 9 to enable sums generated from the addition operations 204A, 204B, 204C to be available for subsequent operations that use the sums as inputs. As also shown in the bootstrapping schedule 200, the data dependency of $m_2\_m_2$ on $mrg\_m_2\_a_0a_1$, which in turn is dependent upon $mrg\_a_0a_1$ causes the $m_2\_m_2$ multiplication operation to a minimum schedule time of AL+2+AL+2, where AL denotes the adder latency. For a 4-cycle adder, the minimum schedule time is therefore twelve. Nodes $m_0\_m_2$ and $m_1\_m_2$ depend on $mrg\_m_2\_a_0a_1$ and are scheduled at time 10 and time 11, respectively. Nodes, $m_2\_m_0$ and $m_2\_m_1$, which both depend on the node $mrg\_a_0a_1$, are respectively scheduled at time 8 and time 9. Finally, the four remaining multiplication operations (as shown at time 4, time 5, time 6, and time 7) only depend on registered inputs X and Y. Thus, the only constraint is to schedule these four multiplication operations before time-step 9, which is when data for the next multiplication (e.g., involving inputs other than X and Y) may overwrite the input register values. Alternatively, this constraint can be alleviated if input data is written to a generic register file storage location.

Based on the bootstrapping schedule, any remaining operations may be scheduled. In particular, the remaining operations are scheduled such that for each compute unit (Mutt, Add$_0$, and Add$_1$ in FIG. 9), the schedule time of the operation modulo 9 is unique. For example, node $mrg\_m_0m_1\_a_0a_1$ is scheduled at cycle 0 (0 mod 9=0) and $mrg\_m_2\_a_0a_1$ is scheduled at cycle 6 (6 mod 9=6) for Add$_0$ (e.g., a first add/sub unit). This means that no other operation may be scheduled at time-steps 0 and 6 (mod 9) on Add$_0$. It can be seen that this constraint holds for the twelve nodes that bootstrap the schedule when determining how to schedule remaining nodes. In one embodiment, the modulo schedule is constructed starting with an ASAP (As-Soon-As-Possible) schedule, where each node may be shifted-up in schedule by at most eight positions (meaning nine total slots may be evaluated).

Figure 10:
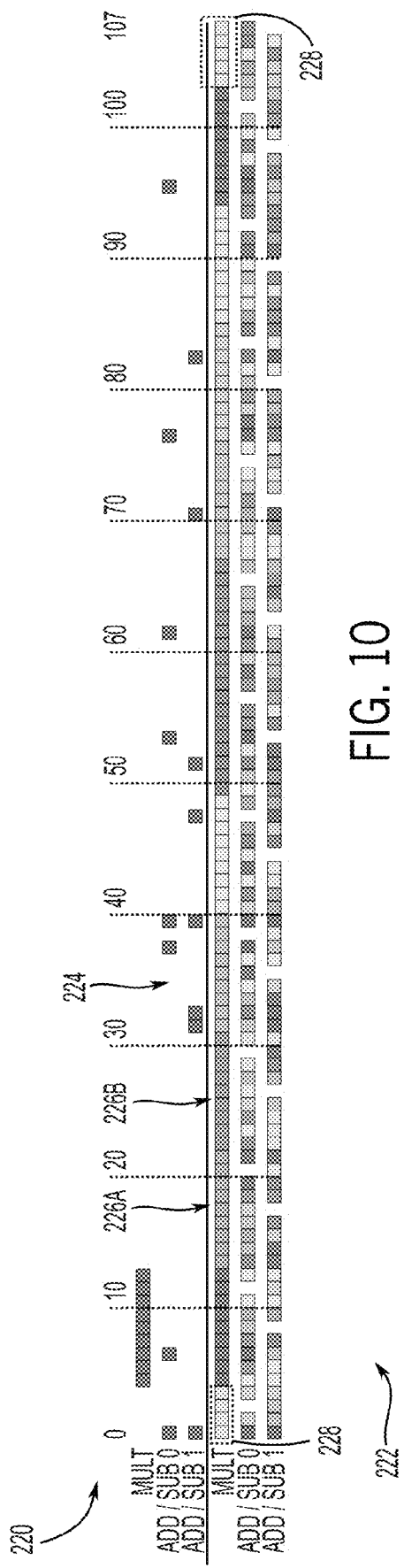
FIG. 10 illustrates a modulo schedule for folded integer multiplier circuitry, in accordance with another embodiment of the present disclosure.

Each iteration of the schedule construction is validated by checking that the schedule times (mod 9) of all nodes on Add$_0$ and Add$_1$ (i.e., the two add/sub units) are unique, and that the reads (mod 9) are unique for each of the six storage elements (e.g., the two registers used by the multiplier and the four registers utilized by the two add/sub units). If found, the valid modulo schedule allows for issuing a new multiplication every nine cycles. That is, multiplication involving two different values may begin every nine clock cycles. An example modulo schedule for a 2048-bit folded integer multiplier having a 21-cycle 514-bit "flat" multiplier and a 4-cycle adder-subtractor unit is shown in FIG. 10. In particular, FIG. 10 illustrates a first schedule 220 for a first channel (e.g., a multiplication of X and Y) and a second schedule 222 for when twelve channels are active. As illustrated, addition operations 224 for the first channel may be performed after multiplication operations 226 (e.g., multiplication operations 226A, 226B) associated with other channels have begun (and, in the case of multiplication operations 226A, 226B, been completed).

The schedule of different channels is identical to that of the first, with a start-of-schedule shift of 9×K for K∈N and K<12 and a wrap around the modulo value (as indicated by multiplication operation 228 that is performed in two parts). Moreover, for the modulo schedule length (e.g., 108 cycles), no schedule gaps exist for the multiplier, thus ensuring one-hundred percent utilization of the multiplier. Each of the add/sub units is idle for twelve cycles out of 108, resulting in an adder utilization efficiency greater than over eighty-eight percent.

Figure 11:
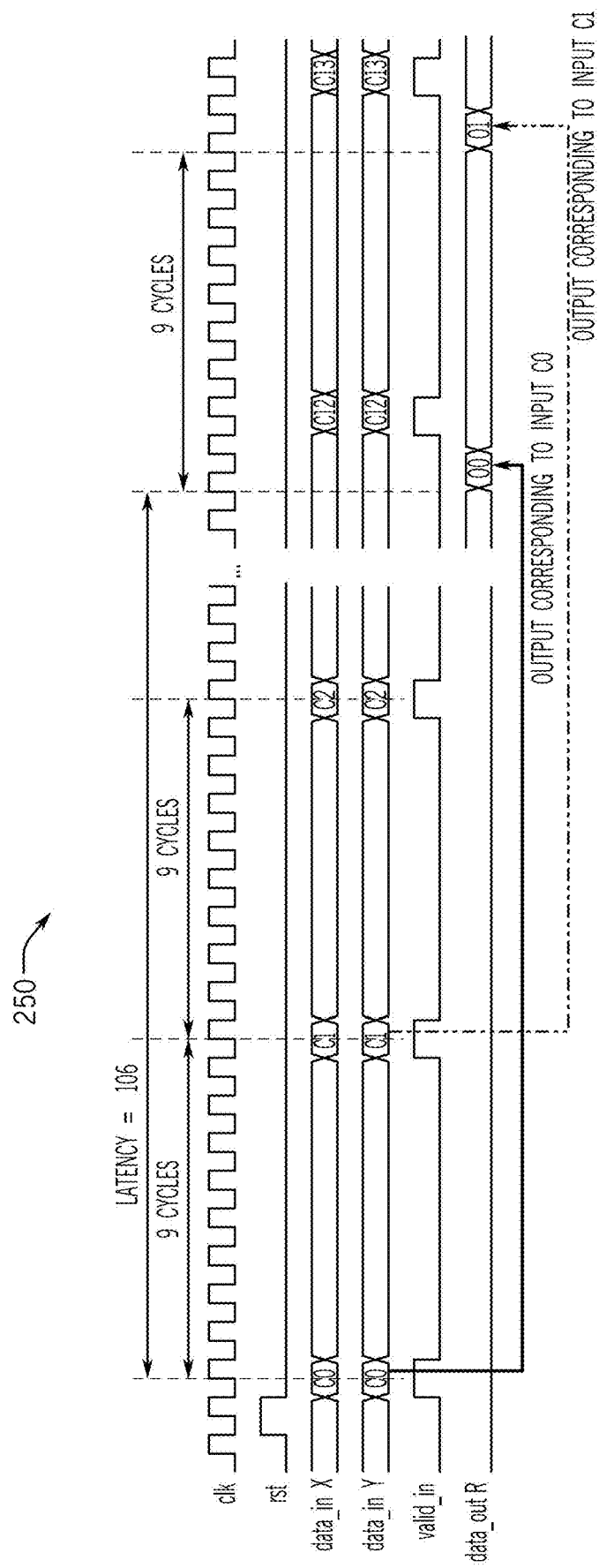
FIG. 11 illustrates a timing diagram which shows the timing of data being loaded into folded integer multiplier circuitry, in accordance with embodiments of the present disclosure.

Continuing with the drawings, FIG. 11 is a timing diagram 250 illustrating how data is fed into the FIM circuitry 26. After the initial reset stage ("rst"), new data that includes both inputs X and Y is provided to the inputs of the FIM circuitry 26 together with a high valid signal ("valid_in") every nine cycles. After a number of cycles (e.g., 106 cycles) the FIM circuitry 26 outputs become available on the data out port ("data_out R"). Moreover, after the initial pipeline fill, a new result is available every nine cycles.

Lastly, before discussing an architecture for the FIM circuitry 26, register allocation will be discussed. When performing register allocation, the design generator 100 may attempt to reduce the number of entries (e.g., values) required in a storage element. For example, in one embodiment, the goal is not to exceed thirty-two entries per storage element. Register allocation may be performed based on a graph-coloring technique, the liveness is computed for each variable (operation), for C=[Latency/9] channels (the number of 2048-bit multiplications alive simultaneously in hardware). A graph is constructed for each storage element where nodes correspond to variable writes and edges correspond to liveness overlap between nodes. The graph is colored with the minimum number of colors such that adjacent nodes are filled with different colors. The number of colors corresponds to storage element entries, and the color is converted to an address for writing and reading from the storage element. With the described register allocation, each of the proposed folded integer multipliers (e.g., folded integer multiplier in Table 2 below) utilizes thirty-two or fewer entries per storage element.

Figure 12:
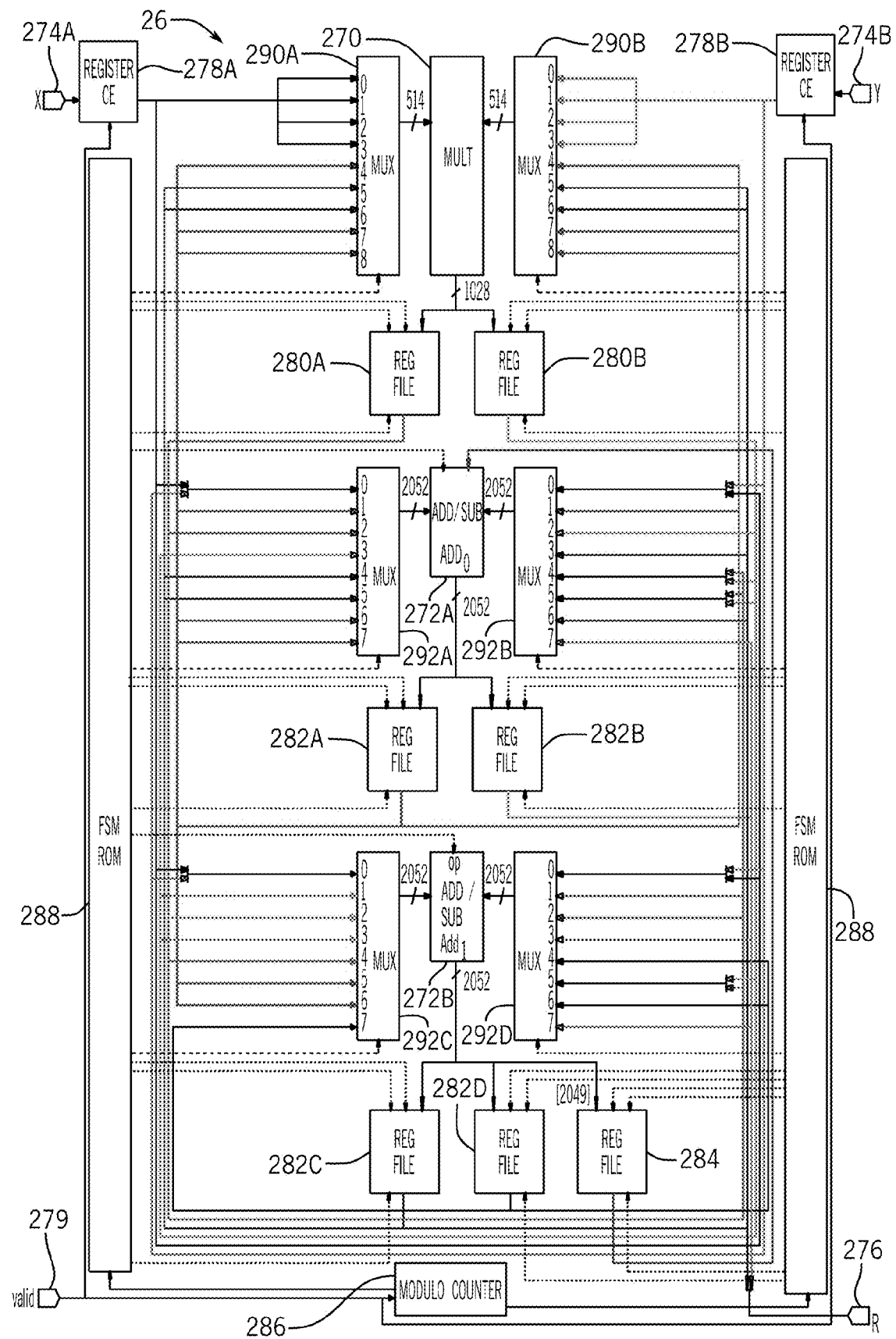
FIG. 12 is a block diagram of folded integer multiplier circuitry, in accordance with embodiments of the present disclosure.

Continuing with the drawings, FIG. 12 is a diagram of an embodiment of the FIM circuitry 26. More specifically, the FIM circuitry 26 illustrated in FIG. 12 is a 2048-bit folded integer multiplier that includes a multiplier 270 with a latency of 33 clock cycles and two addition/subtraction (add/sub) units 272 (e.g., addition/subtraction units 272A, 272B) that have an adder latency of four clock cycles. The multiplier 270 may be the 514-bit wide multiplier discussed above, and the add/sub units 272 may be the 2052-bit add/sub units discussed above. The FIM circuitry 26 may receive inputs 274A, 274B (e.g., X and Y) and determine and output a product 276 following the techniques described above. In other words, the FIM circuitry 26 may determine a product of the inputs 274A, 274B by performing nine multiplication operations and sixteen operations involving addition or subtraction, all of which involve values having narrower widths than the width the inputs 274, 274B.

The inputs 274A, 274B may respectively be written in registers 278A, 278B (e.g., when receiving a high valid_in signal 279) to be utilized by the multiplier 270 and add/sub units 272. Furthermore, the FIM circuitry 26 may include registers (e.g., registers 280A, 280B, 282A, 282B, 282C, 282D, 284) used to store values generated by the multiplier 270 or add/sub units 272. More specifically, registers 280A, 280B receive and store products computed by the multiplier 270, registers 282A, 282B receive and store values (e.g., sums or differences) computed by the add/sub unit 272A, and registers 282C, 282D receive and store values (e.g., sums or differences) computed by the add/sub unit 272B. The register 284 may be a one-bit register used to store a carry-out bit generated when performing addition associated with node 152A.

The FIM circuitry includes control circuitry, which may include a modulo counter 286 and FSM ROM 288. The modulo counter 286 may control the FSM ROM 208 to cause the FIM circuitry 26 to perform multiplication operations and operations involving addition or subtraction in accordance with the schedule 222 of FIG. 10. For example, the FSM ROM 208 stores values for control wires in the FIM circuitry 26, and the control circuitry may provide signals to multiplexers 290 (e.g., multiplexer 290A, 290B) and multiplexers 292 (e.g., multiplexers 292A, 292B, 292C, 292D) to respectively control inputs to the multiplier 270 and the add/sub units 272.

Figure 13A:
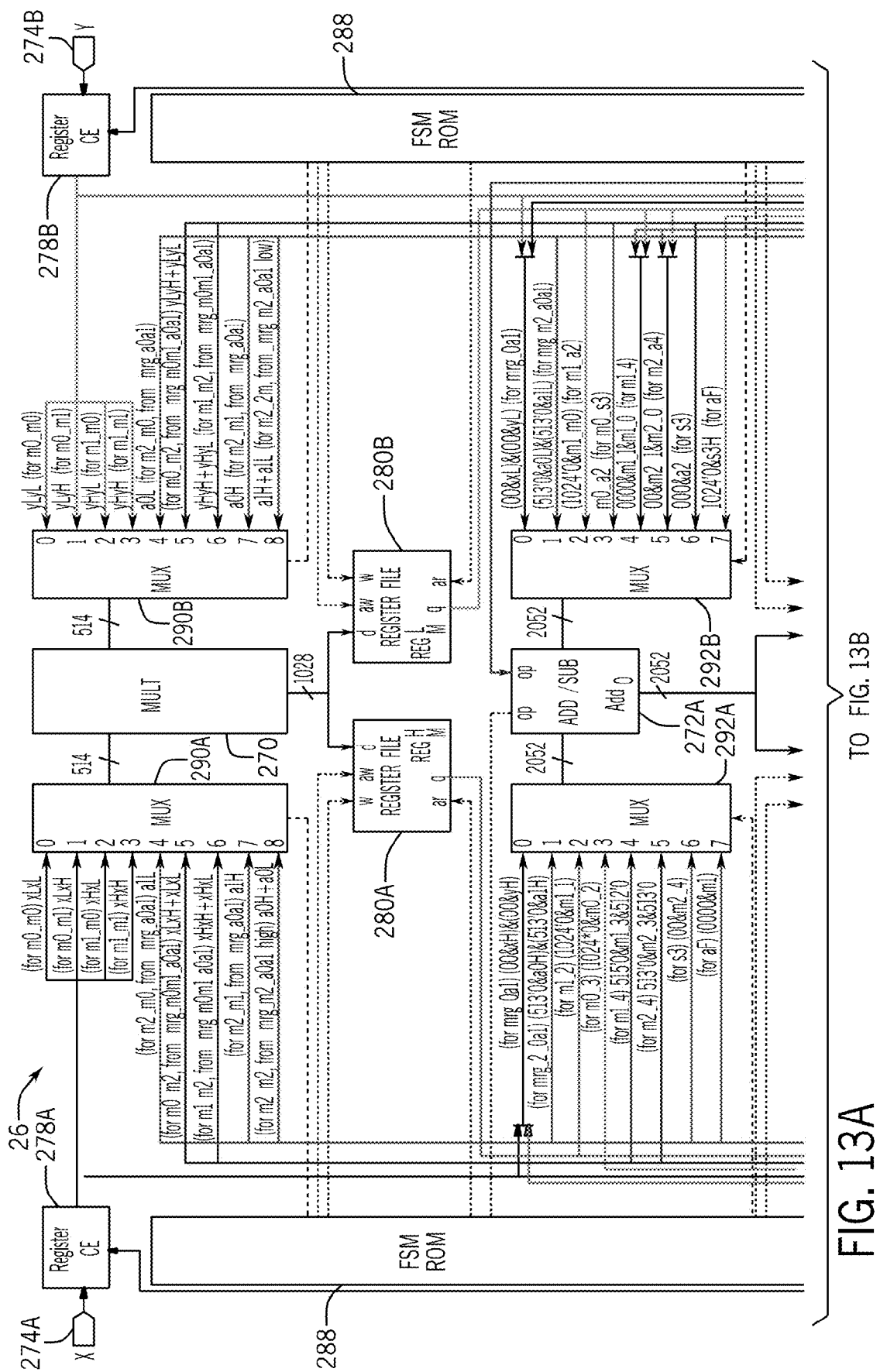
FIG. 13A illustrates a first portion of the folded integer multiplier circuitry of FIG. 12, in accordance with embodiments of the present disclosure.
Figure 13B:
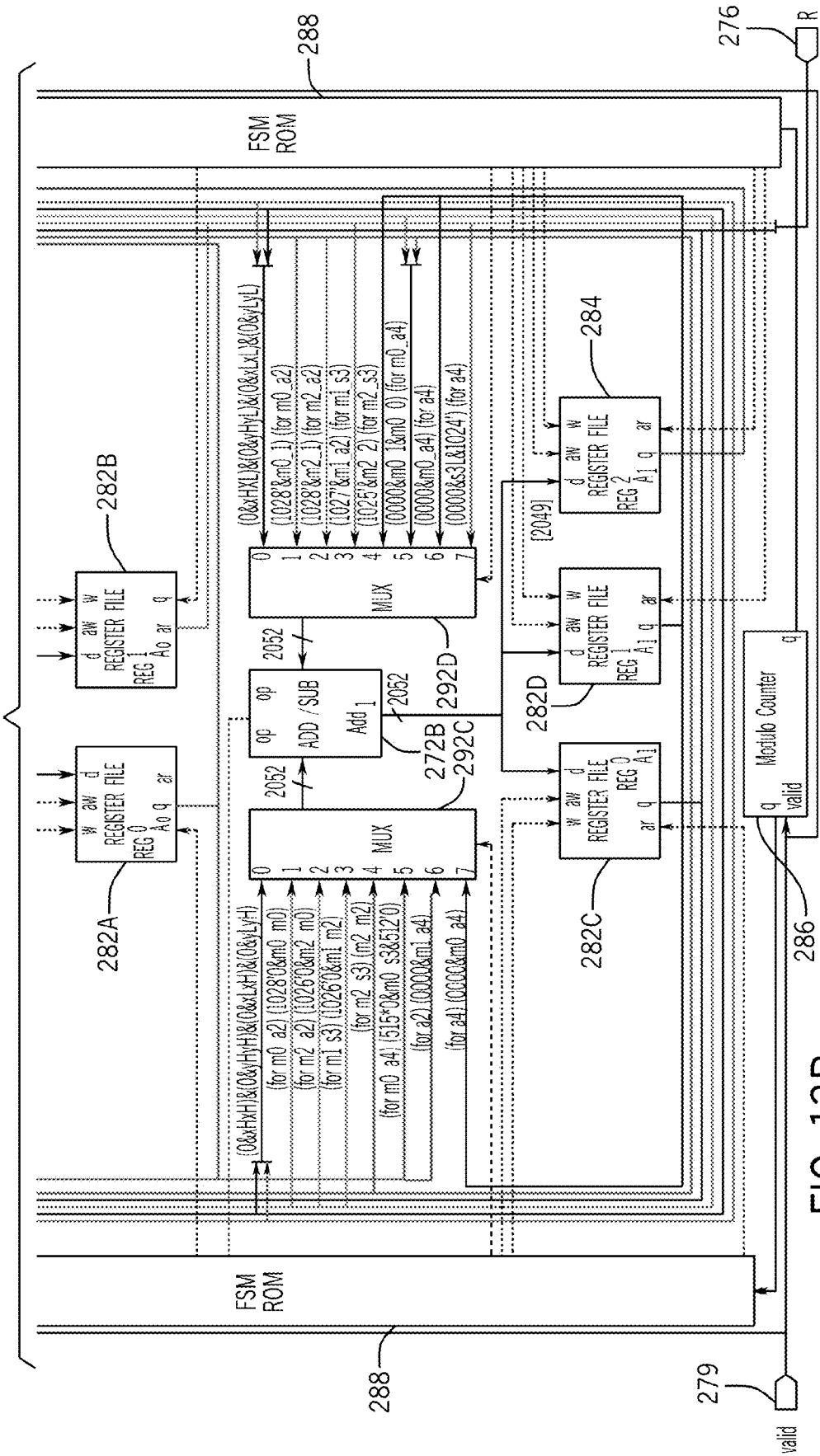
FIG. 13B illustrates a second portion of the folded integer multiplier circuitry of FIG. 12, in accordance with embodiments of the present disclosure.

FIG. 12 also illustrates routing between the various components of the FIM 26. FIG. 13A and FIG. 13B show portions of the FIM 26 of FIG. 12 but also include more information about data that may be associated with various routing in the FIM 26.

The techniques described herein enable scalable hardware implementations. For example, while FIG. 12 illustrates a 2048-bit folded integer multiplier, other embodiments of the FIM circuitry 26 may support different widths. Several examples of other embodiments, along with performance information, are provided in Table 2 below.

TABLE 2

| FPGA | Component Type | Width (bits) | Target FMax | Latency | Performance ALMs | Regs | DSPs | M20Ks | FMax(-1) | Throughput |
|---|---|---|---|---|---|---|---|---|---|---|
| Arria ® 10 | multiplier | 66 | 500 MHz | 10 | 405 | 1907 | 6 | 0 | 536 MHz | 1 |
| | | 130 | 500 MHz | 11 | 1071 | 4394 | 15 | 0 | 520 MHz | 1 |
| | | 258 | 500 MHz | 22 | 5800 | 23226 | 45 | 0 | 503 MHz | 1 |
| | | 514 | 450 MHz | 33 | 22838 | 90192 | 135 | 0 | 446 MHz | 1 |
| | add-sub | 260 | 500 MHz | 4 | 395 | 1110 | 0 | 0 | 643 MHz | 1 |
| | | 516 | 500 MHz | 4 | 750 | 2129 | 0 | 0 | 626 MHZ | 1 |
| | | 1028 | 500 MHz | 4 | 1556 | 4246 | 0 | 0 | 554 MHZ | 1 |
| | | 2052 | 450 MHz | 4 | 3127 | 8477 | 0 | 0 | 449 MHZ | 1 |
| | FIM | 256 | 500 MHz | 100 | 3523 | 5797 | 6 | 2 | 529 MHz | 1/9 |
| | FIM | 512 | 500 MHz | 100 | 7191 | 12313 | 15 | 2 | 496 MHz | 1/9 |
| | FIM | 1024 | 400 MHZ | 106 | 16987 | 38926 | 45 | 2 | 421 MHz | 1/9 |
| | FIM | 2048 | 400 MHz | 118 | 40896 | 119156 | 135 | 2 | 377 MHz | 1/9 |
| Stratix ® 10 | FIM | 2048 | 500 MHZ | 118 | 54621 | 131416 | 135 | 2 | 402 MHz | 1/9 |

Figure 14:
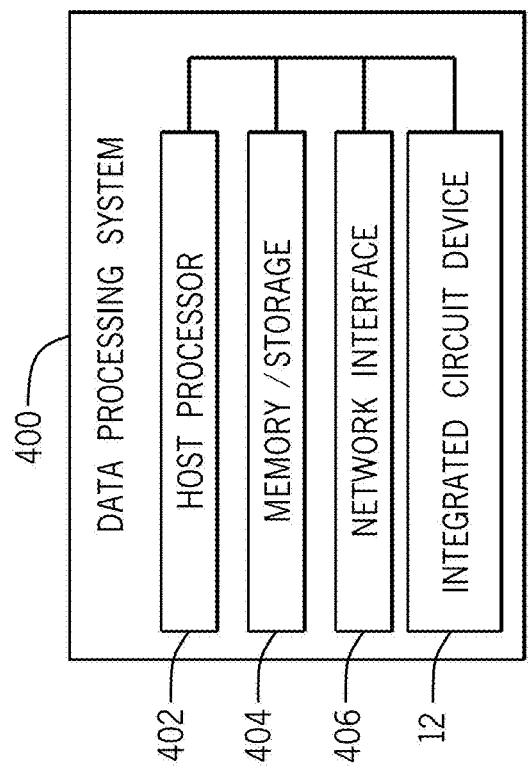
FIG. 14 is a data processing system, in accordance with an embodiment of the present disclosure.

Bearing the foregoing in mind, the integrated circuit 12, may include the folded integer multiplier circuitry 26 and interfaces to connect to other integrated circuit devices. In addition, the integrated circuit device 12 may be a data processing system or a component included in a data processing system. For example, the integrated circuit device 12 may be a component of a data processing system 400, shown in FIG. 14. The data processing system 400 may include a host processor 402 (e.g., a central-processing unit (CPU)), memory and/or storage circuitry 404, and a network interface 406. The data processing system 400 may include more or fewer components (e.g., electronic display, user interface structures, application specific integrated circuits (ASICs)). The host processor 402 may include any suitable processor, such as an INTEL® Xeon® processor or a reduced-instruction processor (e.g., a reduced instruction set computer (RISC), an Advanced RISC Machine (ARM) processor) that may manage a data processing request for the data processing system 400 (e.g., to perform encryption, decryption, machine learning, video processing, voice recognition, image recognition, data compression, database search ranking, bioinformatics, network security pattern identification, spatial navigation, cryptocurrency operations, or the like). The memory and/or storage circuitry 404 may include random access memory (RAM), read-only memory (ROM), one or more hard drives, flash memory, or the like. The memory and/or storage circuitry 404 may hold data to be processed by the data processing system 400. In some cases, the memory and/or storage circuitry 404 may also store configuration programs (bitstreams) for programming the integrated circuit device 12. The network interface 406 may allow the data processing system 400 to communicate with other electronic devices. The data processing system 400 may include several different packages or may be contained within a single package on a single package substrate. For example, components of the data processing system 400 may be located on several different packages and/or cards at one location (e.g., a data center) or multiple locations. For instance, components of the data processing system 400 may be located in separate geographic locations or areas, such as cities, states, or countries.

In one example, the data processing system 400 may be part of a data center that processes a variety of different requests. For instance, the data processing system 400 may receive a data processing request via the network interface 406 to perform encryption, decryption, machine learning, video processing, voice recognition, image recognition, data compression, database search ranking, bioinformatics, network security pattern identification, spatial navigation, digital signal processing, or some other specialized task.

Furthermore, in some embodiments, the folded integer multiplier circuitry 26 and data processing system 400 may be virtualized. That is, one or more virtual machines may be utilized to implement a software-based representation of the folded integer multiplier circuitry 26 and data processing system 400 that emulates the functionalities of the folded integer multiplier circuitry 26 and data processing system 400 described herein. For example, a system (e.g., that includes one or more computing devices) may include a hypervisor that manages resources associated with one or more virtual machines and may allocate one or more virtual machines that emulate the folded integer multiplier circuitry 26 or data processing system 400 to perform multiplication operations and other operations described herein.

Accordingly, the techniques described herein enable folded integer multipliers (e.g., FIM circuitry 26) to be designed, implemented on integrated circuit devices, and utilized to perform multiplication associated with various applications, such as encryption and decryption. As described herein, the FIM circuitry 26 may be implemented in a highly efficient manner (e.g., in which multiplier 270 is performing multiplication one-hundred percent of the time and add/sub units 282 are performing addition or subtraction operations more than eighty-eight percent of the time). As such, technical effects of the present disclosure include multiplication being performed with reduced latency and high throughput.

While the embodiments set forth in the present disclosure may be susceptible to various modifications and alternative forms, specific embodiments have been shown by way of example in the drawings and have been described in detail herein. However, it should be understood that the disclosure is not intended to be limited to the particular forms disclosed. The disclosure is to cover all modifications, equivalents, and alternatives falling within the spirit and scope of the disclosure as defined by the following appended claims.

The techniques presented and claimed herein are referenced and applied to material objects and concrete examples of a practical nature that demonstrably improve the present technical field and, as such, are not abstract, intangible, or purely theoretical. Further, if any claims appended to the end of this specification contain one or more elements designated as "means for [perform]ing [a function] . . . " or "step for [perform]ing [a function] . . . ", it is intended that such elements are to be interpreted under 35 U.S.C. 112(f). However, for any claims containing elements designated in any other manner, it is intended that such elements are not to be interpreted under 35 U.S.C. 112(f).

Example Embodiments of the Disclosure

The following numbered clauses define certain example embodiments of the present disclosure.

CLAUSE 1.

Folded integer multiplier (FIM) circuitry, comprising:
a multiplier configurable to perform multiplication; and
a first addition/subtraction unit and a second addition/subtraction unit, both configurable to perform addition and subtraction, wherein the FIM circuitry is configurable to determine a plurality of products for a plurality of pairs of input values having a first number of bits, wherein the FIM circuitry is configurable to determine each product of the plurality of products by:
  performing, using the multiplier, a plurality of multiplication operations involving values having fewer bits than the first number of bits, wherein the plurality of multiplication operations comprises a first number of multiplication operations and the multiplier is configurable to begin performing all multiplication operations of the plurality of multiplication operations within a first number of clock cycles equal to the first number of multiplication operations; and
  performing, using the first and second addition/subtraction units, a plurality of operations involving addition or subtraction.

CLAUSE 2.

The FIM circuitry of clause 1, further comprising:
a first set of two registers configurable to receive and store first values generated by the multiplier from performing the plurality of multiplication operations;
a second set of two registers configurable to receive and store second values generated by the first addition/subtraction unit from performing a first portion of the plurality of operations involving addition or subtraction; and a third set of registers configurable to receive and store third values generated by the second addition/subtraction unit from performing a second portion of the plurality of operations involving addition or subtraction.

CLAUSE 3.

The FIM circuitry of clause 2, wherein the first and second addition/subtraction units are communicatively coupled to the first set of two registers and configurable to:
receive one or more of the first values;
perform an operation of the plurality of plurality of operations involving addition or subtraction using the one or more first values.

CLAUSE 4.

The FIM circuitry of clause 2, wherein the multiplier is communicatively coupled to a first register of the second set of two registers and configurable to:
receive one or more of the second values;
perform a multiplication operation of the plurality of plurality of multiplication operations using the one or more second values.

CLAUSE 5.

The FIM circuitry of clause 4, wherein the multiplier is not communicatively coupled to a second register of the second set of two registers.

CLAUSE 6.

The FIM circuitry of clause 1, wherein the FIM is implemented on a programmable logic device.

CLAUSE 7.

The FIM circuitry of clause 6, wherein the programmable logic device comprises a field-programmable gate array (FPGA).

CLAUSE 8.

The FIM circuitry of clause 7, wherein the multiplier is implemented using hard logic of the FPGA, and the first and second addition/subtraction units are implemented using soft logic of the FPGA.

CLAUSE 9.

The FIM circuitry of clause 1, wherein the multiplier is a 514-bit multiplier and each of the first and second addition/subtraction units is a 2052-bit addition/subtraction unit.

CLAUSE 10.

The FIM circuitry of clause 1, further comprising control circuitry and a plurality of multiplexers, wherein the control circuitry is configurable to control the plurality of multiplexers to cause a first set of the values having fewer bits than the first number of bits to the multiplier.

CLAUSE 11.

The FIM circuitry of clause 1, wherein the FIM circuitry is configurable to:
output a first product of the plurality of products; and
output a second product of the plurality of products the first number of clock cycles after outputting the first product.

CLAUSE 12.

An integrated circuit device, comprising:
a multiplier configurable to perform multiplication; and
a first addition/subtraction unit and a second addition/subtraction unit, both configurable to perform addition and subtraction, wherein the integrated circuit device is configurable to determine a plurality of products for a plurality of pairs of input values having a first number of bits, wherein the integrated circuit device is configurable to determine each product of the plurality of products by:
performing, using the multiplier, a plurality of multiplication operations involving values having fewer bits than the first number of bits, wherein the plurality of multiplication operations comprises a first number of multiplication operations and the multiplier is configurable to begin performing each multiplication operation of the plurality of multiplication operations in a first number of consecutive clock cycles equal to the first number of multiplication operations; and
performing, using the first and second addition/subtraction units, a plurality of operations involving addition or subtraction.

CLAUSE 13.

The integrated circuit device of clause 12, wherein:
the plurality of multiplication operations has a first number of total operations;
the plurality of operations involving addition or subtraction has a second number of total operations; and
a ratio of the second number of total operations to the first number of total operations is less than two.

CLAUSE 14.

The integrated circuit device of clause 13, wherein:
the first number of total operations is nine; and
the second number of total operations is sixteen.

CLAUSE 15.

The integrated circuit device of clause 12, wherein the both the first and second addition/subtraction units are configurable to being performing a portion of the plurality of operations involving addition or subtraction prior to the multiplier beginning to perform the plurality of multiplication operations.

CLAUSE 16.

The integrated circuit device of clause 12, wherein the multiplier is configurable to being performing multiplication operations associated with a first pair of the plurality of pairs of input values while the first and second addition/subtraction units are performing addition operations associated with a second pair of the plurality of pairs of input values.

CLAUSE 17.

The integrated circuit device of clause 12, wherein performing the plurality of operations involving addition or subtraction comprises performing addition involving two values having fewer bits than the first number of bits.

CLAUSE 18.

A field-programmable gate array (FPGA) comprising:
a multiplier configurable to perform multiplication;
a first addition/subtraction unit and a second addition/subtraction unit, both configurable to perform addition and subtraction;
a first set of registers configurable to store one or more products generated by the multiplier;
a second set of registers configurable to store one or more first values generated by the first addition/subtraction unit;
a third set of registers configurable to store one or more second values generated by the second addition/subtraction unit;
a first multiplexer communicatively coupled to the multiplier, wherein the first multiplexer is configurable to select a first received value as a first operand to provide to the multiplier based on a first control signal of a plurality of control signals;
a second multiplexer communicatively coupled to the multiplier, wherein the first multiplexer is configurable to select a second received value as a second operand to provide to the multiplier based on a second control signal of the plurality of control signals; and
control circuitry communicatively coupled to the first and second multiplexers, wherein the control circuitry is configurable to output the plurality of control signals to cause the FPGA to determine a plurality of products for a plurality of pairs of input values having a first number of bits, wherein the FPGA is configurable to determine each product of the plurality of products by:

performing, using the multiplier and based on the plurality of control signals, a plurality of multiplication operations involving values having fewer bits than the first number of bits, wherein the plurality of multiplication operations comprises a first number of multiplication operations and the multiplier is configurable to begin performing each multiplication operation of the plurality of multiplication operations in a sequence of consecutive clocks cycles; and performing, using the first and second addition/subtraction units, a plurality of operations involving addition or subtraction.

CLAUSE 19.

The FPGA of clause 18, wherein the control circuitry is configurable to:

cause a sum stored in the second set of registers to be provided the first multiplexer; and cause the first multiplexer to output the sum to the multiplier.

CLAUSE 20.

The FPGA of clause 18, wherein:

the first and second addition/subtraction units are implemented completely on programmable logic of the FPGA; and the multiplier implemented using DSP blocks of the FPGA.

What is claimed is:

1. Folded integer multiplier (FIM) circuitry, comprising:
a multiplier configurable to perform multiplication;
a first addition/subtraction unit and a second addition/subtraction unit, both configurable to perform addition and subtraction, wherein the FIM circuitry is configurable to determine a plurality of products for a plurality of pairs of input values having a first number of bits, wherein the FIM circuitry is configurable to determine each product of the plurality of products by:
performing, using the multiplier, a plurality of multiplication operations involving values having fewer bits than the first number of bits, wherein the plurality of multiplication operations comprises a first number of multiplication operations and the multiplier is configurable to begin performing all multiplication operations of the plurality of multiplication operations within a first number of clock cycles equal to the first number of multiplication operations; and
performing, using the first and second addition/subtraction units, a plurality of operations involving addition or subtraction;
a first set of two registers configurable to receive and store first values generated by the multiplier from performing the plurality of multiplication operations;
a second set of two registers configurable to receive and store second values generated by the first addition/subtraction unit from performing a first portion of the plurality of operations involving addition or subtraction; and
a third set of registers configurable to receive and store third values generated by the second addition/subtraction unit from performing a second portion of the plurality of operations involving addition or subtraction.

2. The FIM circuitry of claim 1, wherein the first and second addition/subtraction units are communicatively coupled to the first set of two registers and configurable to:
receive one or more of the first values; and
perform an operation of the plurality of operations involving addition or subtraction using the one or more of the first values.

3. The FIM circuitry of claim 1, wherein the multiplier is communicatively coupled to a first register of the second set of two registers and configurable to:
receive one or more of the second values; and
perform a multiplication operation of the plurality of multiplication operations using the one or more of the second values.

4. The FIM circuitry of claim 3, wherein the multiplier is not communicatively coupled to a second register of the second set of two registers.

5. The FIM circuitry of claim 1, wherein the FIM circuitry is implemented on a programmable logic device.

6. The FIM circuitry of claim 5, wherein the programmable logic device comprises a field-programmable gate array (FPGA).

7. The FIM circuitry of claim 6, wherein the multiplier is implemented using hard logic of the FPGA, and the first and second addition/subtraction units are implemented using soft logic of the FPGA.

8. The FIM circuitry of claim 1, wherein the multiplier is a 514-bit multiplier and each of the first and second addition/subtraction units is a 2052-bit addition/subtraction unit.

9. The FIM circuitry of claim 1, further comprising control circuitry and a plurality of multiplexers, wherein the control circuitry is configurable to control the plurality of multiplexers to cause a first set of the values having fewer bits than the first number of bits to the multiplier.

10. The FIM circuitry of claim 1, wherein the FIM circuitry is configurable to:
output a first product of the plurality of products; and
output a second product of the plurality of products the first number of clock cycles after outputting the first product.

11. An integrated circuit device, comprising:
programmable logic;
a multiplier configurable to perform multiplication;
a first addition/subtraction unit and a second addition/subtraction unit, both configurable to perform addition and subtraction, wherein the integrated circuit device is configurable to determine a plurality of products for a plurality of pairs of input values having a first number of bits, wherein the integrated circuit device is configurable to determine each product of the plurality of products by:
performing, using the multiplier, a plurality of multiplication operations involving values having fewer bits than the first number of bits, wherein the plurality of multiplication operations comprises a first number of multiplication operations and the multiplier is configurable to begin performing each multiplication operation of the plurality of multiplication operations in a first number of consecutive clock cycles equal to the first number of multiplication operations; and
performing, using the first and second addition/subtraction units, a plurality of operations involving addition or subtraction;
a first set of two registers configurable to receive and store first values generated by the multiplier from performing the plurality of multiplication operations;

a second set of two registers configurable to receive and store second values generated by the first addition/subtraction unit from performing a first portion of the plurality of operations involving addition or subtraction; and a third set of registers configurable to receive and store third values generated by the second addition/subtraction unit from performing a second portion of the plurality of operations involving addition or subtraction.

12. The integrated circuit device of claim 11, wherein:
the plurality of multiplication operations has a first number of total operations;
the plurality of operations involving addition or subtraction has a second number of total operations; and
a ratio of the second number of total operations to the first number of total operations is less than two.

13. The integrated circuit device of claim 12, wherein:
the first number of total operations is nine; and
the second number of total operations is sixteen.

14. The integrated circuit device of claim 11, wherein both the first addition/subtraction unit and the second addition/subtraction unit are configurable to begin performing the plurality of operations involving addition or subtraction prior to the multiplier beginning to perform the plurality of multiplication operations.

15. The integrated circuit device of claim 11, wherein the multiplier is configurable to begin performing multiplication operations associated with a first pair of the plurality of pairs of input values while the first and second addition/subtraction units are performing addition operations associated with a second pair of the plurality of pairs of input values.

16. The integrated circuit device of claim 11, wherein performing the plurality of operations involving addition or subtraction comprises performing addition involving two values having fewer bits than the first number of bits.

17. The integrated circuit device of claim 11, wherein:
the first addition/subtraction unit is implemented using the programmable logic;
the second addition/subtraction unit is implemented using the programmable logic; or
both the first addition/subtraction unit and the second addition/subtraction unit are implemented using the programmable logic.

18. A field-programmable gate array (FPGA) comprising:
a multiplier configurable to perform multiplication;
a first addition/subtraction unit and a second addition/subtraction unit, both configurable to perform addition and subtraction;
a first set of registers configurable to store one or more products generated by the multiplier;
a second set of registers configurable to store one or more first values generated by the first addition/subtraction unit;
a third set of registers configurable to store one or more second values generated by the second addition/subtraction unit;
a first multiplexer communicatively coupled to the multiplier, wherein the first multiplexer is configurable to select a first received value as a first operand to provide to the multiplier based on a first control signal of a plurality of control signals;
a second multiplexer communicatively coupled to the multiplier, wherein the first multiplexer is configurable to select a second received value as a second operand to provide to the multiplier based on a second control signal of the plurality of control signals; and
control circuitry communicatively coupled to the first and second multiplexers, wherein the control circuitry is configurable to output the plurality of control signals to cause the FPGA to determine a plurality of products for a plurality of pairs of input values having a first number of bits, wherein the FPGA is configurable to determine each product of the plurality of products by:
performing, using the multiplier and based on the plurality of control signals, a plurality of multiplication operations involving values having fewer bits than the first number of bits, wherein the plurality of multiplication operations comprises a first number of multiplication operations and the multiplier is configurable to begin performing each multiplication operation of the plurality of multiplication operations in a sequence of consecutive clock cycles; and
performing, using the first and second addition/subtraction units, a plurality of operations involving addition or subtraction.

19. The FPGA of claim 18, wherein the control circuitry is configurable to:
cause a sum stored in the second set of registers to be provided to the first multiplexer; and
cause the first multiplexer to output the sum to the multiplier.

20. The FPGA of claim 18, wherein:
the first and second addition/subtraction units are implemented completely on programmable logic of the FPGA; and
the multiplier is implemented using DSP blocks of the FPGA.

* * * * *